(12) United States Patent
Yanagihara et al.

(10) Patent No.: US 6,552,775 B1
(45) Date of Patent: Apr. 22, 2003

(54) EXPOSURE METHOD AND APPARATUS

(75) Inventors: Masamitsu Yanagihara, Zama; Tomohiro Katsume, Yokohama, both of (JP)

(73) Assignee: Nikon Corporation, Tokyo (JP)

( * ) Notice: Subject to any disclaimer, the term of this patent is extended or adjusted under 35 U.S.C. 154(b) by 19 days.

(21) Appl. No.: 09/718,373

(22) Filed: Nov. 24, 2000

(30) Foreign Application Priority Data

Nov. 26, 1999 (JP) ............................................ 11-336472
Oct. 17, 2000 (JP) ............................................ 12-316451

(51) Int. Cl.[7] ........................ G03B 27/52; G03B 27/72; A61N 5/00; G21K 5/10; G03C 5/00
(52) U.S. Cl. ............................. 355/55; 355/35; 355/67; 355/70; 355/77; 250/492.2; 250/492.22; 430/311; 430/312; 430/314
(58) Field of Search .............................. 355/35, 55, 67, 355/70, 77; 250/492.2, 492.22; 430/311, 312, 314

(56) References Cited

U.S. PATENT DOCUMENTS

| | | | |
|---|---|---|---|
| 5,602,620 A | * | 2/1997 | Miyazaki et al. ............. 355/53 |
| 5,614,988 A | | 3/1997 | Kato et al. |
| 5,617,211 A | * | 4/1997 | Nara et al. ................... 356/401 |
| 5,729,331 A | | 3/1998 | Tanaka et al. |
| 5,929,973 A | * | 7/1999 | Kakizaki et al. .............. 355/26 |
| 5,959,784 A | | 9/1999 | Seki et al. |
| 5,999,244 A | * | 12/1999 | Yanagihara et al. .......... 355/53 |

* cited by examiner

Primary Examiner—Russell Adams
Assistant Examiner—Khaled Brown
(74) Attorney, Agent, or Firm—Oblon, Spivak, McClelland, Maier & Neustadt, P.C.

(57) ABSTRACT

An exposure apparatus and a method which make it possible to enhance the fineness of pattern in spite of the trend to enlarge the size of the photosensitive substrate and device. In this apparatus, a mask and the photosensitive substrate are allowed to synchronously scan, and the optical projecting system thereof is provided with a scanning direction adjusting means which is designed to adjust the position of scanning direction of a projected image to be projected onto the substrate, wherein a non-linear component of error is determined in advance and the result thus determined is stored as a correction value for the apparatus, thereby enabling the pattern exposure to be performed while continuously controlling the image-adjusting mechanism on the basis of the correction value.

23 Claims, 21 Drawing Sheets

Correcting mechanism of lens module

Normal plate

Plate deformed due to processing

EXPOSURE METHOD AND APPARATUS

BACKGROUND OF THE INVENTION

This invention relates to a scanning exposure apparatus provided with a plurality of optical projecting systems and a plurality of illumination systems, and also to an exposure method. In particular, this invention relates to a scanning exposure apparatus wherein the adjustment of position among the optical systems thereof can be facilitated to thereby make it suited for performing the exposure of substrate which has been deformed in the processing of the substrate, and also to an exposure method which is suited for performing the exposure of substrate which has been deformed in the processing of the substrate.

In recent years, due to the reasons that a prominent improvement in display quality has been made in the liquid crystal diaplay apparatus and that the liquid crystal display apparatus is thin in structure and light in weight, the liquid crystal display apparatus is now increasingly employed as an image display device in place of the CRT. In particular, there has been a prominent advance in enlarging the active area of direct viewing type liquid crystal panel of active matrix system, so that the size of glass substrate to be employed for manufacturing such an enlarged liquid crystal panel is also increasingly enlarged.

As for the exposure apparatus for carrying out an exposure for forming an element pattern of display panel on such a large glass substrate, there is known a scanning exposure apparatus wherein an original image pattern image formed on a photomask or reticle (hereinafter referred to simply as a mask) is projected through an optical projecting system on the surface of the glass substrate (hereinafter referred to also as a photosensitive substrate), and concurrently, the mask and photosensitive substrate are scanned relative to the optical projecting system.

One example of such an optical projecting apparatus as mentioned above will be explained with reference to FIGS. 22 and 23 which show a scanning exposure apparatus designed to carry out an exposure treatment on a glass substrate. FIG. 22 shows a perspective view schematically illustrating the construction of a conventional scanning exposure apparatus, and FIG. 22 shows a main portion of the scanning exposure apparatus shown in FIG. 22.

Referring to FIGS. 22 and 23, a photosensitive substrate 103 is sustained on a photosensitive substrate stage 102 constituting a bottom portion of a carriage 101 having a U-shaped cross-section, and a mask 105 is retained by a mask stage 104 which is disposed over and facing the photosensitive substrate stage 102.

By way of exposure light irradiated from an optical illuminating system 106, a pattern constituting a portion of region of the mask 105 retained by the mask stage 104 is illuminated, and the exposure light that has passed through the mask 105 is then allowed to pass through an optical image-forming system (or an optical projecting system) 107, thereby enabling the pattern constituting a portion of region of the mask 105 to be transcribed to a portion of the surface region of the photosensitive substrate 103.

In this case, the mask stage 104 bearing the mask 105 and the photosensitive substrate stage 102 sustaining the photosensitive substrate 103 are scanned relative to the optical image-forming system 107, thereby allowing the entire pattern region of the mask 105 to be transcribed to the surface of the photosensitive substrate 103.

The optical image-forming system 107 in this case is constituted by a plurality of optical projecting systems 107a to 107d instead of a single optical projecting system, thereby allowing a plurality of small regions of the mask 105 to be concurrently irradiated by the luminous flux irradiated from the optical illuminating system 106. As a result, the images of these plural number of small regions are concurrently transcribed through a plurality of optical projecting systems 107a to 107d onto the surface of the photosensitive substrate 103.

FIG. 24 shows the exposure images of the scan and step according to the aforementioned scanning exposure apparatus. Referring to FIG. 24, the optical image-forming system (or an optical projecting system) 107 has an exposure field as shown in FIG. 24, so that the optical image-forming system 107 is scanned twice (SCAN 1 and SCAN 2) in the direction A (scanning direction) relative to the photosensitive substrate 103, and, after finishing the scanning of SCAN 2 and being stepped in the direction B, further scanned twice (SCAN 3 and SCAN 4) in the direction C (scanning direction), thus finishing the transcription of the entire mask pattern.

Further, the sustaining mechanism for the photosensitive substrate 103 is provided with an XY stage of long stroke which makes it possible to perform the scan and step. Whereas the retaining mechanism for the mask 105 is provided with an X stage of long stroke for scanning and with a small stroke stage for correcting the Y-direction as well as the rotational direction so as to make it possible to adjust the position thereof relative to the photosensitive substrate 103.

In the exposure operation of the aforementioned exposure apparatus, the projected image of a pattern formed in the mask 105 is required to be accurately superimposed with the pattern layer that has been formed in advance on the photosensitive substrate 103. Therefore, an alignment between the mask 105 and the photosensitive substrate 103 is required to be performed.

For the purpose of performing the alignment, the alignment mark formed on the mask 105 as well as the alignment mark formed on the photosensitive substrate 103 are observed by means of an alignment microscope 108 to detect any misregistration between them, and then, a correction of the positional relationship between the mask 105 and the photosensitive substrate 103 is performed. On both end portions in the direction of Y of both photosensitive substrate 103 and the mask 105, there are a plurality of alignment marks which are formed along the direction of X, so that any one of or plurality of these alignment marks are observed by means of the alignment microscope 108. Then, based on the result detected by this alignment microscope 108, the position and size of the photosensitive substrate 103 relative to the mask 105 are recognized. Therefore, based on this recognition, the position of the mask 105 is adjusted, or the magnification of the optical image-forming system 107 is corrected.

FIG. 25 illustrates the operation of alignment between the mask 105 and the photosensitive substrate 103, which will be performed using the aforementioned scanning exposure apparatus.

For example, when it is found as a result of detection by means of an alignment microscope 108 that the photosensitive substrate 103 is shifted parallel in the directions of X and Y relative to the mask 105 as shown in FIG. 25(a), an actuator which is designed to shift a mask table holding the mask 105 in the direction of X as well as a pair of actuators which are designed to shift a mask table holding the mask 105 in the direction of Y are actuated so as to enable the mask 105 to be shifted parallel to a suitable degree (the correction of shift).

On the other hand, when a rotational mismatch around the Z-axis is found between the photosensitive substrate 103 and the mask 105 as shown in FIG. 25(*b*), a pair of actuators which are designed to shift a mask table holding the mask 105 in the direction of Y are actuated to a different magnitude from each other to enable the mask 105 to rotate to a suitable degree (the correction of rotation). Furthermore, a difference in relative size is found between the photosensitive substrate 103 and the mask 105 as shown in FIG. 25(*c*), the magnification of the optical image-forming system 107 is corrected in the direction of Y, and at the same time, the actuator for shifting the mask table in the direction of X is actuated so as to enable the mask 105 to be shifted in the direction of X while allowing the carriage 101 to move for scanning, thereby suitably changing the relative scanning speed between the mask 105 and the photosensitive substrate 103, thus correcting the magnification in the direction of X (the correction of scale).

Specifically, when the photosensitive substrate 103 is extended by a magnitude of 4 ppm in the direction of X, the actuator for shifting the mask table in the direction of X is actuated so as to enable the mask 105 to be shifted by a magnitude of 4 ppm in the direction opposite to the scanning direction of the carriage 101.

By the way, the alignment mark of the mask 105 is formed in advance on the occasion of manufacturing the mask, while the alignment mark of the photosensitive substrate 103 is generally formed on the occasion of the first exposure treatment.

As explained above, since the aforementioned scanning exposure apparatus is provided with an optical alignment system for performing a lap exposure, thus enabling it to perform alignment measurements at a plurality of points on every occasion of scanning, it is possible, on the basis of each result of the alignment measurement, to calculate the linear components of the shift in the scanning direction, of the shift in the non-scanning direction, of the magnification, of the rotation and of the orthogonality, the calculated results being subsequently taken into account in the scanning exposure. With respect to each of the shifts, rotation, orthogonality and the magnification of scanning direction, they can be corrected by shifting the relative position between the mask and the photosensitive substrate. Whereas, with respect to the magnification of non-scanning direction, it can be corrected by correcting the magnification correction mechanism and the shifting mechanism of non-scanning direction, which are disposed in each of the optical image-forming systems.

In the case of the aforementioned conventional exposure apparatus where a plurality of optical projecting systems are employed, a plurality of optical projecting systems (hereinafter, each optical projecting system will be referred to as a module) which are designed to achieve the synthesis of images are individually fabricated at first so as to secure a predetermined performance and subsequently combined with each other at a sufficiently high positional precision for the synthesis of images. Therefore, the dimensional accuracy of each module is required to be strictly controlled for subsequently combining it with one another. Further, there is a problem that the readjustment of positions of these modules after finishing the combination thereof is required to be performed by repeating the step of re-combining these modules from the beginning.

There is also a possibility when the scanning exposure of mask pattern is performed using the conventional exposure apparatus that due to recent trends to further enlarge the size of liquid crystal device and to further enhance the fineness of image, it may be impossible to obtain a liquid crystal device exhibiting a satisfactory performance only through the aforementioned correction of linear components. Namely, in the step of forming a layer in the manufacture of liquid crystal device, the substrate is more likely to be deformed due to the heating thereof in a manufacturing step other than the exposure step. Therefore, while the absolute value of the residual component of error in the linear correction is inevitably increased due to the recent trend to further enlarge the size of substrate as well as device, it is concurrently required to minimize the residual component of error for the purpose of enhancing the fineness of pattern.

For example, the photosensitive substrate to be transferred to a projecting exposure apparatus so as to receive an exposure treatment is generally subjected to plural times of heat treatment during the manufacturing process thereof and also subjected to a repeated light exposure for transcribing the pattern of original image which will be formed over a plurality of layers. Mainly due to the heat treatments in this manufacturing process, the photosensitive substrate is caused to expand or shrink, thus inviting the deformation of the photosensitive substrate. For example, as shown in FIG. 26(*a*), a photosensitive substrate which is originally rectangular in plan view and rectilinear in each side may be caused to be curved along the direction of Y as shown in FIG. 26(*b*) or caused to be deformed into a parallelogram as shown in FIG. 26(*c*) in the course of various processes.

Therefore, when it is tried to perform a light exposure on this photosensitive substrate that has been deformed as shown in FIGS. 26(*b*) and 26(*c*), the magnitude of deformation in the direction of Y is caused to change successively as the scanning moved in the direction of X in the light exposure operation, thus raising a problem that it is impossible to sufficiently correct the alignment by way of the aforementioned conventional correction of shift, correction of rotation, and correction of scale. If the exposure of a pattern is performed without undergoing accurate alignment, a lap error that cannot be ignored would be generated between the pattern thus exposed and the underlying pattern, resulting in that the properties of a large number of elements formed on the photosensitive substrate would be varied depending the region of the photosensitive substrate.

BRIEF SUMMARY OF THE INVENTION

The present invention has been made in view of overcoming the aforementioned problem, and therefore, it is an object of the present invention to provide an exposure apparatus which is featured in that the adjustment on the occasion of assembling it can be easily performed, and that even if re-adjustment is necessitated during the operation of the apparatus, the re-adjustment can be finished within a short period of time.

Another object of the present invention is to provide an exposure apparatus which is featured in that the residual component of error involved in the linear correction can be minimized in the scanning exposure of a mask pattern, and that an enhanced fineness can be realized even if the size of the photosensitive substrate as well as the device is increasingly enlarged.

A further object of the present invention is to provide an exposure method which is featured in that the residual component of error involved in the linear correction can be minimized in the scanning exposure of a mask pattern, and that an enhanced fineness can be realized even if the size of the photosensitive substrate as well as the device is increasingly enlarged.

In order to overcome the aforementioned problems, the exposure apparatus according to the present invention is provided with a position detecting means for detecting the position of images projected from a plurality of optical projecting systems, and with means for correcting a position error detected by the position detecting means.

Since the exposure apparatus is provided with the means for detecting the position of projected optical images and with means for correcting a position error detected by the position detecting means, the dimensional accuracy of each module is no more required to be strictly controlled, and even if a readjustment is required after finishing the combination of modules, it is no more required to repeat the combination thereof from the beginning.

The present invention also provides an exposure apparatus for projecting a pattern of mask (mask pattern) onto a substrate through an optical projecting system while synchronously scanning a mask having the pattern and the substrate in a predetermined scanning direction, wherein the optical projecting system is featured in that it is provided with a scanning direction adjusting means which is designed to adjust the position of scanning direction of a projected image to be projected onto the substrate.

The optical projecting system may be constructed such that it is formed of a combination of a couple of Dyson type optical systems each system comprising a reflecting prism, a driving member for driving the reflecting prism, lens and a concave mirror, wherein one of these Dyson type optical systems is provided with an optical magnification adjustment system which is disposed at a midway of optical path formed between the reflecting prism and the lens.

Further, the optical projecting system may be constructed such that is provided with a plurality of optical projecting system modules which are disposed along a direction intersecting the scanning direction, and that the scanning direction adjusting means is designed to adjust the position of a projected image in the scanning direction of these optical projecting system modules.

Alternatively, the optical projecting system may be constructed such that it is provided with a plurality of optical projecting system modules, and that the patterning exposure against the substrate is performed by allowing a portion of images projected by these optical projecting system modules to be overlapped with each other.

Additionally, the scanning direction adjusting means may be designed so as to adjust the position of projected image in accordance with changes in configuration of the substrate. Further, the scanning direction adjusting means may be provided with a magnification adjustment mechanism for performing the adjustment of magnification of the optical projecting system and/or an image rotation mechanism for rotating a projected image produced through the optical projecting system.

The present invention also provides an exposure method for projecting a pattern of mask (mask pattern) onto a substrate through an optical projecting system while synchronously scanning a mask having the pattern and the substrate in a predetermine scanning direction, wherein the exposure method is featured in that it comprises a step of adjusting the position of scanning direction of a projected image to be projected on the substrate by means the optical projecting system.

In this case, the optical projecting system may be constructed such that it is provided with a plurality of optical projecting system modules which are disposed along a direction intersecting the scanning direction, and that the adjustment of position of scanning direction is performed by adjusting the position of a projected image in the scanning direction of each of these optical projecting system modules.

Alternatively, the optical projecting system may be constructed such that it is provided with a plurality of optical projecting system modules, and that the patterning exposure against the substrate is performed by allowing a portion of images projected by these optical projecting system modules to be overlapped with each other.

Additionally, the adjustment in position of scanning direction may be performed in accordance with changes in configuration of the substrate.

Further, the exposure method according to the present invention may further comprises a step of performing the adjustment of magnification of the optical projecting system and/or a step of rotating an image projected through the optical projecting system.

The adjustment in position of a projected image during an exposure step by means of the optical projecting system can be performed in accordance with changes in configuration of the substrate which may be generated in the course of treating steps. As for the magnitude in deformation of substrate, it can be determined by measuring a plurality of alignment marks disposed at predetermined locations of the substrate. Further, it is also possible to accurately measure any deformation all over the substrate by measuring the position of patterns which are regularly arranged on the surface of the substrate. It is possible in this case to approximately accurately grasp the magnitude of deformation of substrate by measuring at first the position of patterns which has been detected through a pattern matching and then, by statistically processing the date obtained from the aforementioned measurement.

It is now possible to adjust the relative positional relationship between an image projected and the substrate by rotating or shifting the image projected by the optical projection system, or by changing the magnification of image thus projected so as to conform it with the deformation of substrate which has been measured as mentioned above.

DETAILED DESCRIPTION OF THE INVENTION

Next, one embodiment according to the present invention will be explained in details with reference to the drawings.

Figure 1:
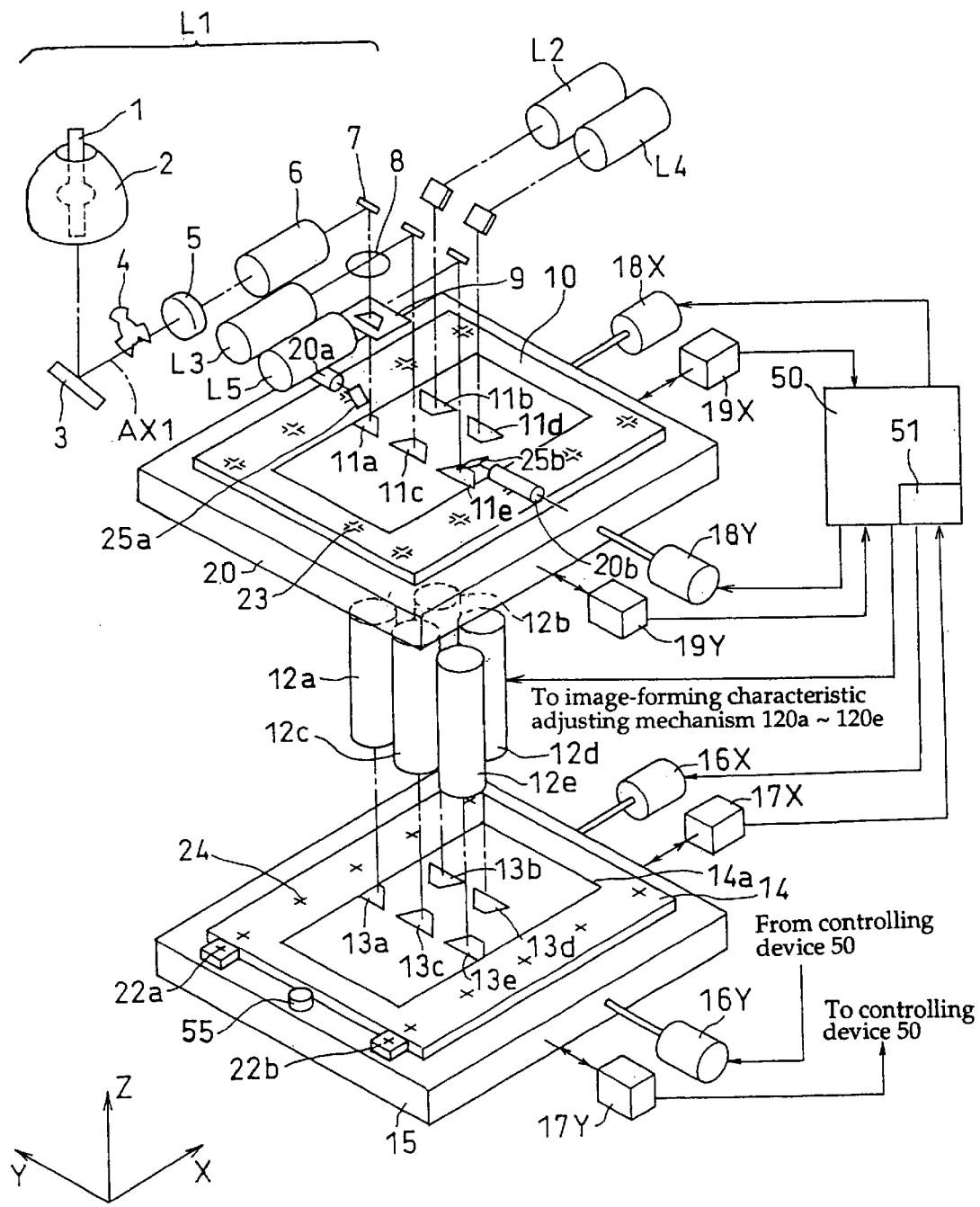
FIG. 1 is an exploded view schematically illustrating one example of scanning exposure apparatus according to the present invention.

FIG. 1 schematically illustrates one example of scanning exposure apparatus according to the present invention. Referring to FIG. 1, a flux of light emitted from a light source 1 such as an ultra-high pressure mercury lamp is allowed to enter into a dichroic mirror 3 after being reflected by an elliptical mirror 2. It is possible with this dichroic mirror 3 to reflect a flux of light having a wavelength which is required for the exposure while allowing a flux of light of other wavelengths to pass therethrough. The flux of light that has been reflected by this dichroic mirror 3 is selectively restricted from being irradiated to the optical projecting system side by means of a shutter 4 which is disposed regressively relative to the optical axis AX1. When the shutter 4 is opened, the light flux is introduced into a wavelength selecting filter 5 thereby producing a light flux having a wavelength (generally, g-, h- or i-beam) which is suited for enabling the optical projecting system 12a to execute the transcription. Further, since the distribution in intensity of this light flux takes a Gaussian distribution wherein the intensity of light becomes maximum in the vicinity of optical axis and gradually lowered at the marginal portion, it is required to make at least the projecting region 13a of the optical projecting system 12a uniform in intensity. For this purpose, a combination of a fly-eye lens 6 and a condenser lens 8 is employed for realizing the aforementioned uniformity of light flux. By the way, a mirror 7 is a bending mirror which is disposed at a midway of light flux.

The light flux that has been made uniform in intensity is then irradiated onto the surface of pattern of mask 10 through a field diaphragm 9. This field diaphragm 9 is provided with an opening for restricting the projection region 13a on a photosensitive substrate 14. A lens unit may be interposed between the field diaphragm 9 and the mask 10 to thereby render the field diaphragm 9, the patterned surface of the mask 10 and the photosensitive substrate 14 to become conjugated with each other.

When the construction starting from the light source 1 up to the field diaphragm 9 is assumed as being an illuminating optical system L1, additional illuminating optical systems, for example L2 to L5 each having the same construction as that of the illuminating optical system L1 are disposed in the same manner so as to feed the light fluxes from the illuminating optical systems L2 to L5 to each of optical projecting systems 12b to 12e. The light flux that has been emitted from each of these illuminating optical systems L1 to L5 is irradiated onto each of individual partial regions (illumination regions) 11a to 11e of the surface of mask 10. In this case, the direction of optical axis of each of optical projecting systems 12a to 12e is defined as Z-direction, the scanning direction of both mask 10 and photosensitive substrate 14 which is perpendicular to the Z-direction is defined as X-direction, and a direction which is perpendicular to both of these Z and X directions is defined as Y-direction.

These partial regions 1a to 11e can be defined as being a plurality of field diaphragms each having a trapezoidal opening so as to define the irradiating region of exposure light directed to the mask 10, wherein the partial regions 11l, 11c and 11e constituting the second row are arranged in a staggered manner relative to the partial regions 11b and 11d constituting the first row. In the normal position of these field diaphragms, the partial regions 11b and 11d of the first row and the partial regions 11a, 11c and 11e of the second row are positioned in such a relationship that the end portions in the direction of Y of the field diaphragm belonging to the first row is partially (or to a predetermined extent) overlapped with the end portions in the direction of Y of the field diaphragm belonging to the second row as viewed in the direction of X. The region of this end portion which is overlapped by a predetermined magnitude in the direction of X in each of these partial regions 11a to 11e will be referred hereinafter to as being a joint region. On the occasion of scanning exposure, the pattern image of the mask passing through this joint region is duplicatively exposed to the light passing through the partial regions 11b and 11d constituting the first row and also to the light passing through the partial regions 11a, 11c and 11e of the second row, thus receiving an optimum integrated quantity of exposure light. Further, the position of center in the direction of X of each of the partial regions 11b and 11d constituting the first row is spaced apart by a distance "d" from the position of center in the direction of X of each of the partial regions 11a, 11c and 11e of the second row (see FIG. 5).

For the purpose of transcribing the pattern of the mask 10 in the irradiating region to the photosensitive substrate 14, the pattern of the mask 10 being defined by the partial regions 11a to 11e constituting the illumination field diaphragms this scanning exposure apparatus is provided with five optical projecting systems 12a to 12e which are arranged in a staggered manner in conformity with each of the partial regions 11a to 11e. These optical projecting systems 12a to 12e are arranged in two rows and respectively assigned to each of the irradiation regions of the mask 10 which are defined by the partial regions 11a to 11e.

The optical projecting systems 12b and 12d constituting one row (hereinafter, referred to as a first projecting row) as well as the optical projecting systems 12a, 12c and 12e constituting the other row (hereinafter, referred to as a second projecting row) are respectively provided with an image-forming characteristic adjusting mechanism 120 (scanning direction adjusting means). Next, one example of optical projecting system where a pair of Dyson type optical systems are combined as each of the optical projecting systems 12a to 12e will be explained.

Figure 2:
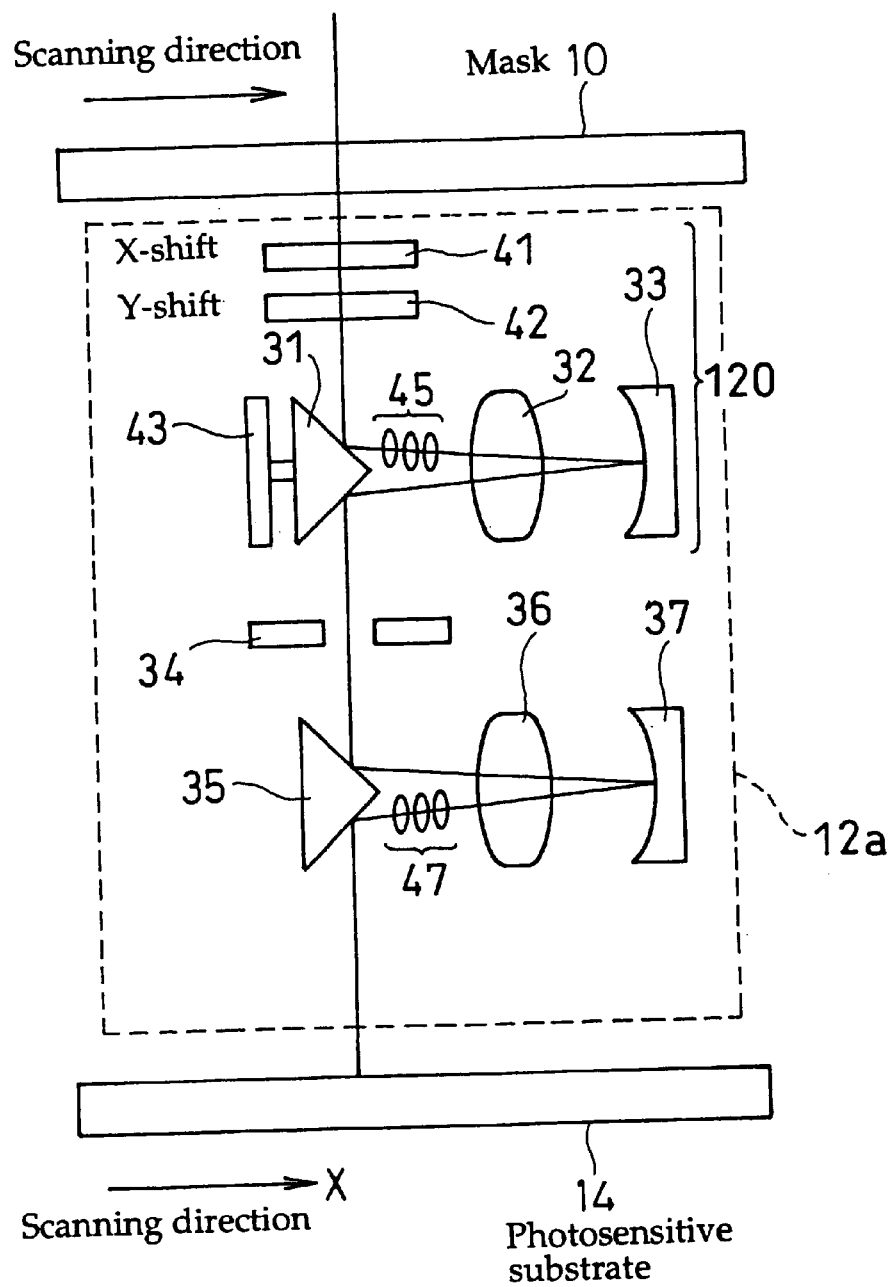
FIG. 2 is a diagram illustrating the correcting mechanism of a lens module installed in an optical projecting system.
Figure 3:
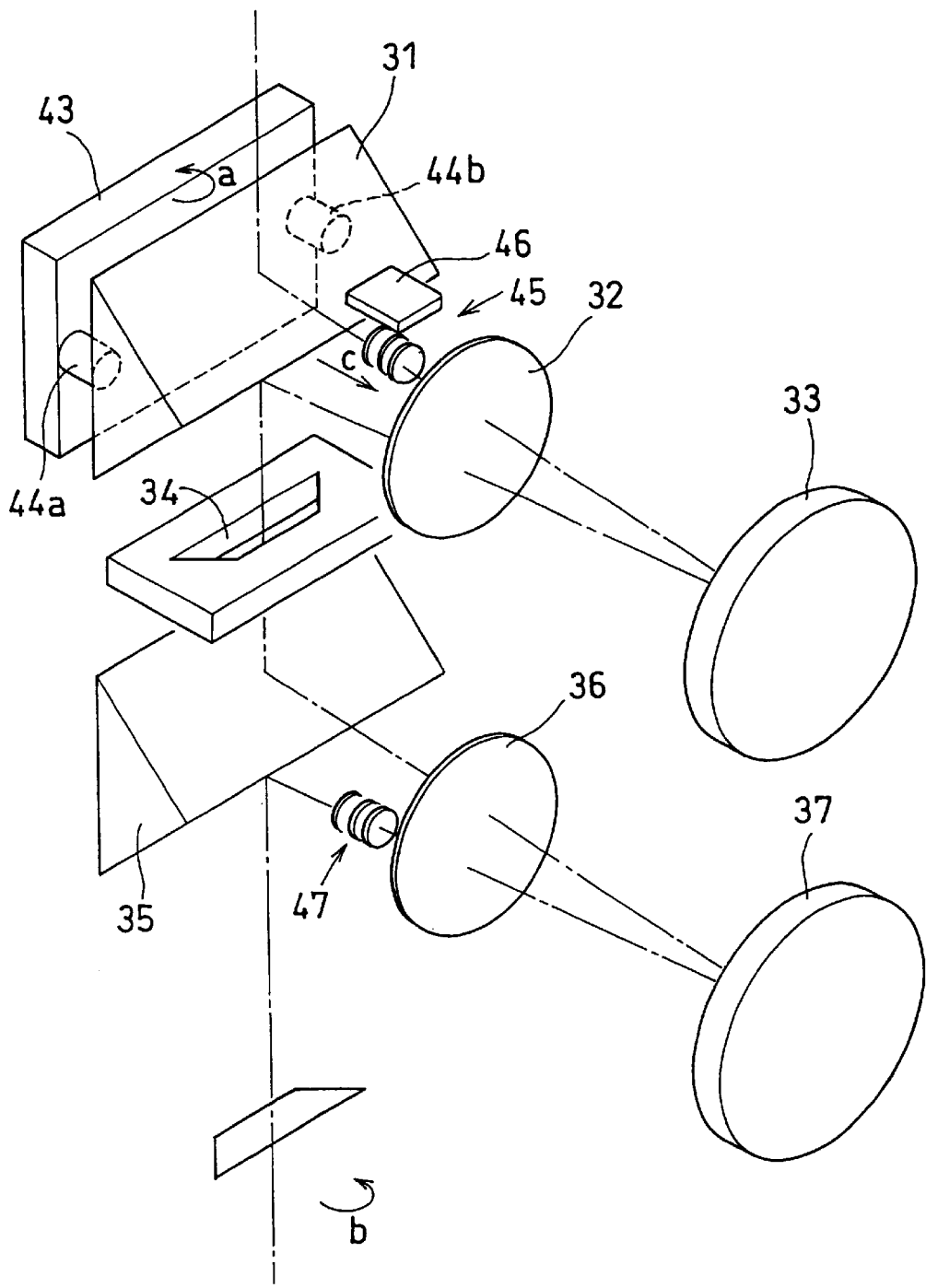
FIG. 3 is a perspective view illustrating in detail an optical projecting system.
Figure 4:
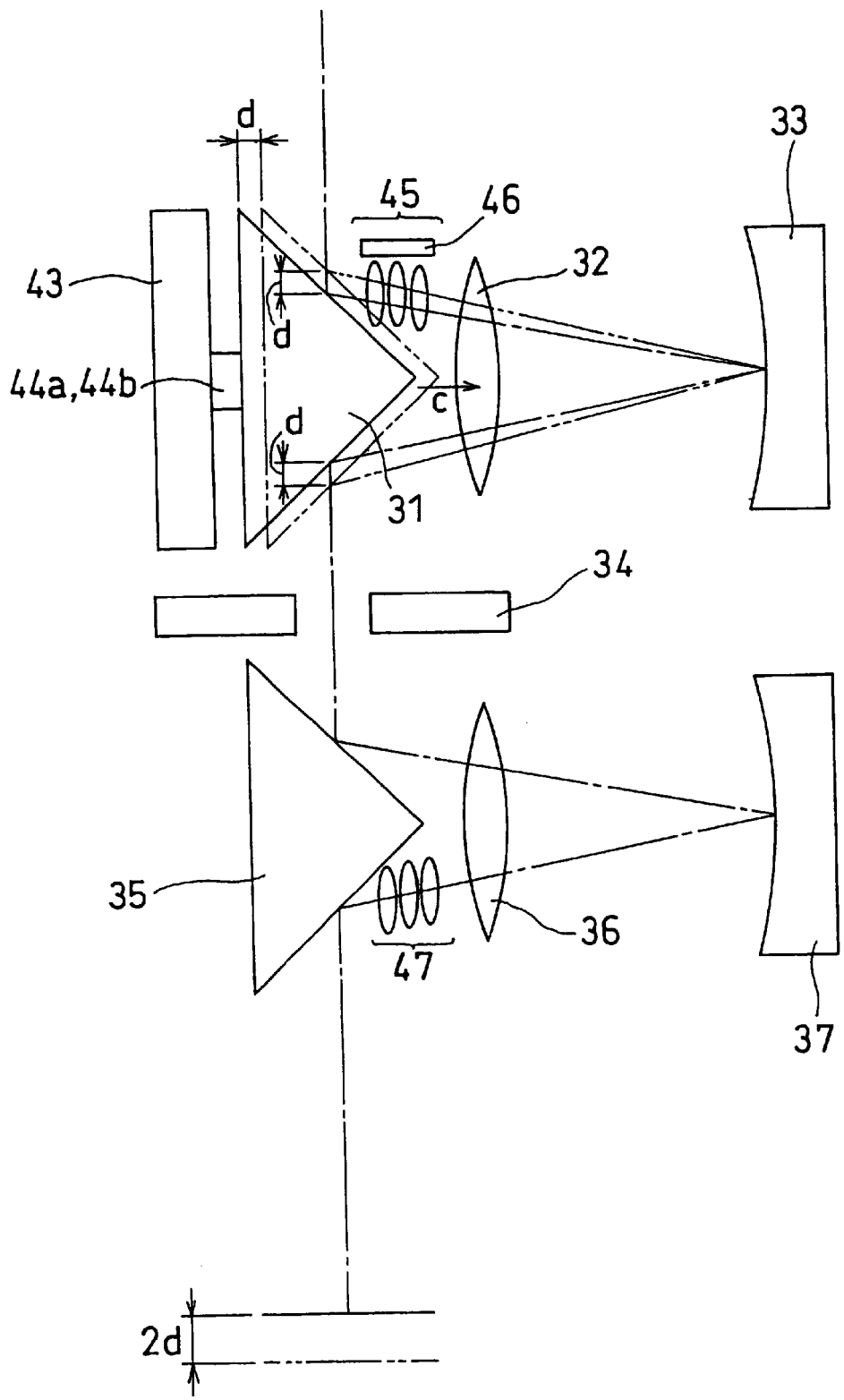
FIG. 4 is a side view illustrating in detail an optical projecting system.

FIGS. 2, 3 and 4 illustrate the correcting mechanism of a lens module which is attached to each of the optical projecting systems 12a, to 12e, wherein one of the optical projecting systems 12a to 12e is schematically exemplified. Namely, since these optical projecting systems 12a to 12e are constructed in the same manner with each other, the image-forming characteristic adjusting mechanism of the optical projecting system 12a will be explained herein as a representative example.

The optical projecting system 12a comprises two units of Dyson type optical system which are combined and disposed one upon another, and is constituted by a first partial optical system 31–33, a field diaphragm 34, and a second partial optical system 35–37. The first partial optical system is constituted by a rectangular prism 31 having a pair of reflective surfaces which are respectively inclined by an angle of plus/minus 45 degrees to the surface mask 10, a lens 32 and a concave mirror 33, both having an optical axis extending along the in-plane direction of the mask 10. The second partial optical system is constituted by a rectangular prism 35 having a pair of reflective surfaces which are respectively inclined by an angle of plus or minus 45 degrees to the surface mask 10, a lens 36 and a concave mirror 37, both having an optical axis extending along the in-plane direction of the mask 10.

The optical projecting system 12a is further provided with an image-forming characteristic adjusting mechanism which is constituted by a shifter portion (shifting mechanism) for shifting a patterned image of the mask 10 to be transcribed onto the photosensitive substrate 14 in conformity with the movement in the directions of X and Y of the mask 10, a rotation correcting portion (rotation correcting mechanism) for rotating a patterned image of the mask 10 to be transcribed onto the photosensitive substrate 14, and a magnification adjusting portion (magnification adjusting mechanism) for adjusting the magnification of the patterned image of the mask 10 to be transcribed onto the photosensitive substrate 14. These shifter portion, rotation correcting portion and magnification adjusting portion of each of the optical projecting systems 12a to 12e are designed to be individually controlled by means of a controlling device 50.

The shifter portion is constituted by plane parallel glass plates 41 and 42 which are disposed immediately below the mask. It is possible, through the rotation of the X-shifting plane parallel glass plate 41 and of the Y-shifting plane parallel glass plate 42 by a driving means such as a motor, to shift a patterned image of the mask 10 to be transcribed onto the photosensitive substrate 14 in the direction of X or Y.

The rotation correcting portion is constructed such that the rectangular prism 31 fixed through a pair of piezo elements 44a and 44b to a prism table 43 is enabled to be rotated about the optical axis as shown in FIG. 3 to thereby perform the correction of rotation. Specifically, when any one of these piezo elements 44a and 44b is actuated, or when both of these piezo elements 44a and 44b are driven in the opposite direction to each other, the rectangular prism 31 can be rotated in a direction shown by the arrow "a" or a direction opposite the arrow "a". As a result, the projecting image is allowed to rotate in the same direction as the rotating direction of the rectangular prism 31.

Additionally, when both of these piezo elements 44a and 44b are extended or shrunk simultaneously and by the same magnitude as shown in FIG. 4, the rectangular prism 31 is caused to shift in the direction indicated by the arrow "c" or the direction opposite to the arrow "c", thereby generating a difference in optical path and changing the position of focus, thus making it possible to perform the adjustment of focus. In the embodiment shown in FIG. 3, the piezo element is disposed at two points. However, three piezo elements may be positioned so as to hold the rectangular prism 31 by three points.

The magnification adjusting portion can be constructed by introducing an optical zooming system 45 constituted by three pieces of optical lens into a midway of one of the optical axes (for example, the optical axis of input side), which is located between the rectangular prism 31 and the lens 32 of the Dyson type optical system constituted by a row of the rectangular prism 31, the lens 32 and the concave mirror 33. Specifically, by controlling the interval of three pieces of optical lens of the optical zooming system 45 by means of an actuator 46, the magnification of projecting image can be controlled. Instead of controlling the intervals of lense of the optical zooming system 45, a gas having a different refractive index from that of air may be substituted for the air filling the space between lenses of the optical zooming system 45, thereby making it possible to vary the magnification of projecting images. By the way, on the occasion of introducing the optical zooming system 45 for adjusting the magnification of image into a midway of optical path of one of the Dyson type optical systems, a optical correcting system 47 constituted by a group of fixed lenses may be introduced into a midway of optical path of the other of the Dyson type optical systems so as to offset the influence generated by the introduction of the optical zooming system 45.

The primary image of the mask 10 that will be formed by the first partial optical system (Dyson type optical system) 31–33 is of an isometric magnification image which is positive in lateral magnification in the direction of X, but is negative in lateral magnification in the direction of Y. The beam from this primary image is transmitted through the second partial optical system 35–37 to the surface of the photosensitive substrate 14 so as to form a secondary image of the mask 10. Therefore, the secondary image to be formed on the surface of the photosensitive substrate 14 would become an erected image of isometric magnification of the mask 10 (an image which is positive in lateral magnification in the vertical direction as well as in the lateral direction). At the position of the primary image to be formed by the first partial optical system, there is disposed the field diaphragm 34.

Further, the initial adjustment of the optical projecting system can be performed by controlling the shifter portion, rotation correcting portion and magnification adjusting portion of each of the optical projecting systems 12a to 12e. For example, by detecting reference marks formed on the mask 10 by means of an image pickup element 55 mounted on the substrate stage 15, the magnitude of rotation of a projected image is determined, and then, on the basis of value thus determined, the magnitude of rotation of the rectangular prism is controlled by the rotation correcting portion of each of the optical projecting systems 12a to 12e so as to make the magnitude of the rotation of image become lowered to not more than a predetermined value. With respect to the shifting of image, the magnitude of shifting the image can be determine by a procedure wherein the plane parallel glass plate of the shifter portion is rotated by a predetermined magnitude so as to monitor the position of mask pattern that has been projected on to the image pickup element 55 mounted on the substrate stage 15. With respect to the magnification also, the magnification can be accurately adjusted by a procedure wherein the mask pattern is projected onto the image pickup element 55 mounted on the substrate stage 15 to thereby monitor the position of the image.

As explained hereinafter, the deformation of substrate at the moment of initiating the exposure differs from the deformation of substrate as the moment of finishing he exposure, so that the image-forming characteristic adjusting mechanism is actuated in the course of exposure so as to conform it with the deformation of substrate that has been measured in advance. In this case, the magnitude of driving the piezo element or motor for altering the image-forming condition and the optical effect to be derived therefrom may be formed into a table in advance, thereby making it possible to conveniently perform the correction.

Figure 5:
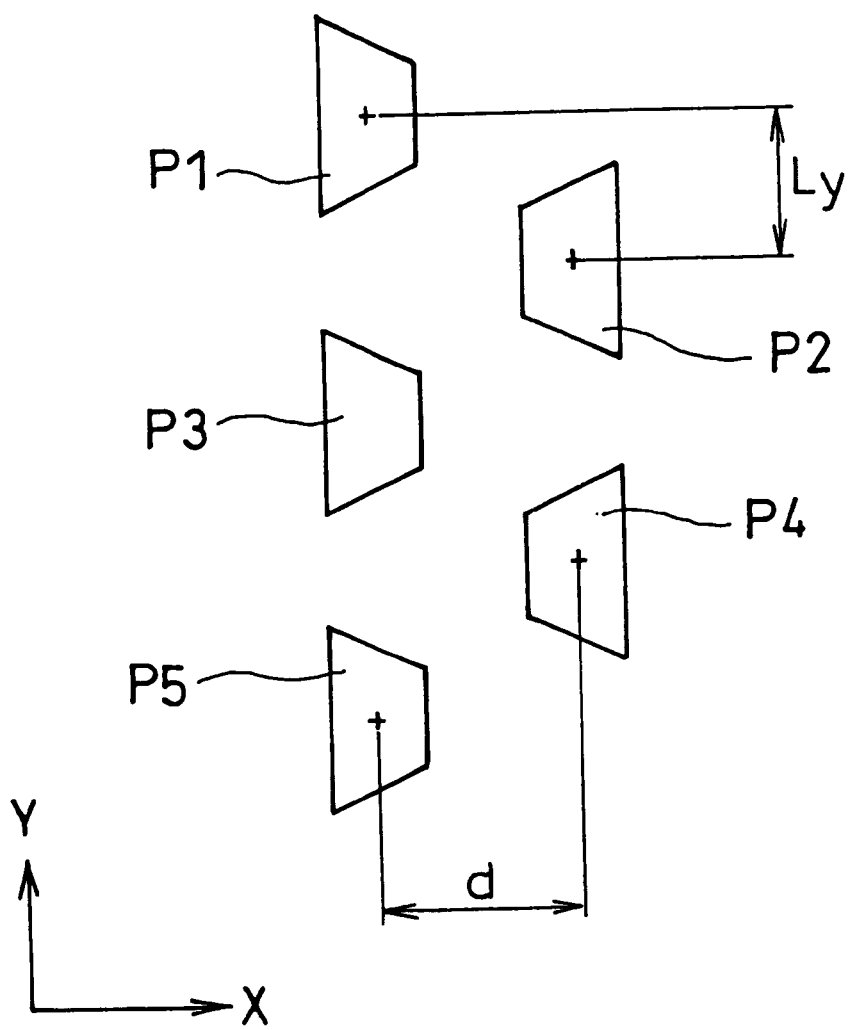
FIG. 5 shows a diagram illustrating the position of transcribed images.

Further, as shown in FIG. 5, the transcribed images P1 to P5 formed on the surface of photosensitive substrate 14 are respectively formed into a trapezoidal configuration. The upper side of each trapezoidal configuration is aligned such that the upper side of the first transcription image row consisting of the transcribed images P2 and P4 faces the upper side of the second transcription image row consisting of the transcribed images P1, P3 and P5. Further, the transcribed images P1 to P5 are arranged such that a neighboring couple of the transcribed images (for example, P1 and P2, or P2 and P3) are spaced apart from each other by a row-to-row spacing of "d" and also by an image-to-image spacing of "Ly" in the directions of X and Y, respectively, as measured based on the center of image, and that, as viewed in the direction of Y, the edge portions of one trapezoidal configuration are overlapped with the edge portions of neighboring trapezoidal configurations.

With respect to the optical axes of these optical projecting systems 12a to 12e also, they are spaced apart from each other by a row-to row spacing of "d" and also by an image-to-image spacing of "Ly" in the directions of X and Y, respectively, in conformity with the arrangement of the centers of these transcribed images P1 to P5. A plurality of illuminating optical systems L1 to L5 are also arranged such that the centers of partial regions 11a to 11e formed on the mask 10 are positioned in the same manner as that of the transcribed images P1 to P5.

A plurality of optical fluxes that have passed through the mask 10 are irradiated, via the optical projecting systems 12a to 12e corresponding respectively to the illuminating optical systems L1 to L5, onto individual projection regions 13a to 13e on the surface of the photosensitive substrate 14 to thereby form the pattern images of the illuminating partial regions 11a to 11e of the mask 10. In this case, all of the optical projecting systems 12a to 12e are formed of an optical system of erected isometric magnification image (erected normal image).

The photosensitive substrate 14 is mounted on the substrate stage 15, which is provided with an X-direction driving device 16X having a long stroke in the scanning direction (X-direction) in order to enable the substrate stage 15 to perform one-dimensional scanning exposure. The substrate stage 15 is also provided with an X-direction position-measuring apparatus (e.g. a laser interferometer) 17X exhibiting a high resolution and a high precision with regard to the scanning direction. The mask 10 is sustained by the mask stage 20, which is also provided, just like the substrate stage 15, with an X-direction driving device 18X having a long stroke in the scanning direction (X-direction) and with an X-direction position-measuring apparatus 19X for detecting the position in the scanning direction of the mask stage 20.

Further, the substrate stage 15 and the mask stage 20 are respectively provided with a function which enables them to move in the direction of Y which intersect substantially orthogonally with the direction of X or the scanning direction. Namely, the substrate stage 15 is provided with a Y-direction driving device 16Y for driving the substrate stage 15 in the direction of Y and also with a Y-direction position-measuring apparatus 17Y. Likewise, the mask stage 20 is provided with a Y-direction driving device 18Y for driving the mask stage 20 in the direction of Y and also with a Y-direction position-measuring apparatus 19Y for detecting the position in the Y-direction of the mask stage 20. The substrate stage 15 is also provided with the image pickup element 55 so as to make it possible to detect the edges of the trapezoidal mask pattern that has been projected onto the photosensitive substrate 14. A Z-stage (not shown) for vertically moving the photosensitive substrate is mounted on the substrate stage 15. By changing the height of the Z-stage on the occasion of the exposure, the relationship thereof to the position of best focus can be found out.

By the way, it is also possible to fix the photosensitive substrate 14 and the mask 10 to a U-shaped scanning frame for example so as to make it possible to drive the photosensitive substrate 14 and the mask 10 as an integral structure in the scanning direction (X-direction). If a driving device for driving the scanning frame mounting thereon the photosensitive substrate 14 and the mask 10 is disposed in this case, it is no more required to separately provide the X-direction driving device 16X for driving the substrate stage 15 in the direction of X and the X-direction driving device 18X for driving the mask stage 20 in the direction of X.

Figure 6:
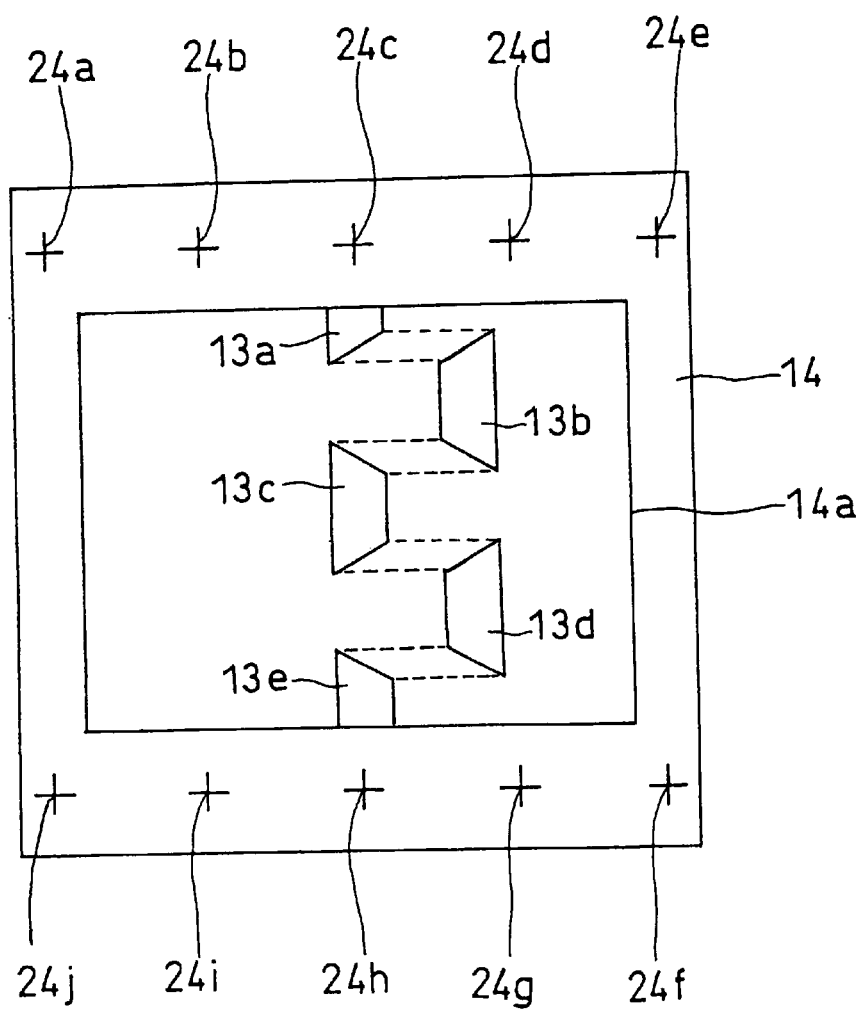
FIG. 6 is a top plan view of a photosensitive substrate held on a substrate stage.

FIG. 6 shows the upper surface of the photosensitive substrate 14 mounted on the substrate stage 15. The projection regions 13a to 13e on the surface of the photosensitive substrate 14 are arranged in such a manner that, as shown in FIG. 6, the regions neighboring to each other in the direction of Y are dislocated from each other by a predetermined distance in the direction of X, and at the same time, the end portions of the regions neighboring to each other are overlapped with each other in the direction of Y as shown by a broken line. Therefore, the aforementioned optical projecting systems 12a to 12e are also arranged in conformity with the arrangement of the projection regions 13a to 13e, so that the regions neighboring to each other are dislocated from each other by a predetermined distance in the direction of X, and at the same time, the end portions of the regions neighboring to each other are overlapped with each other in the direction of Y. Although the projection regions 13a to 13e is formed trapezoidal in configuration, the configuration of the projection regions 13a to 13e may be hexagonal, diamond-shaped, parallelogramic, etc. Further, the illuminating optical systems L1 to L5 are arranged such that the illuminating regions 11a to 11e formed on the mask 10 are disposed in the same manner as that of the projection regions 13a to 13e. The photosensitive substrate 14 is provided with alignment marks (substrate marks) 24a to 24j which are formed in a peripheral region outside the exposure region 14a.

Figure 7:
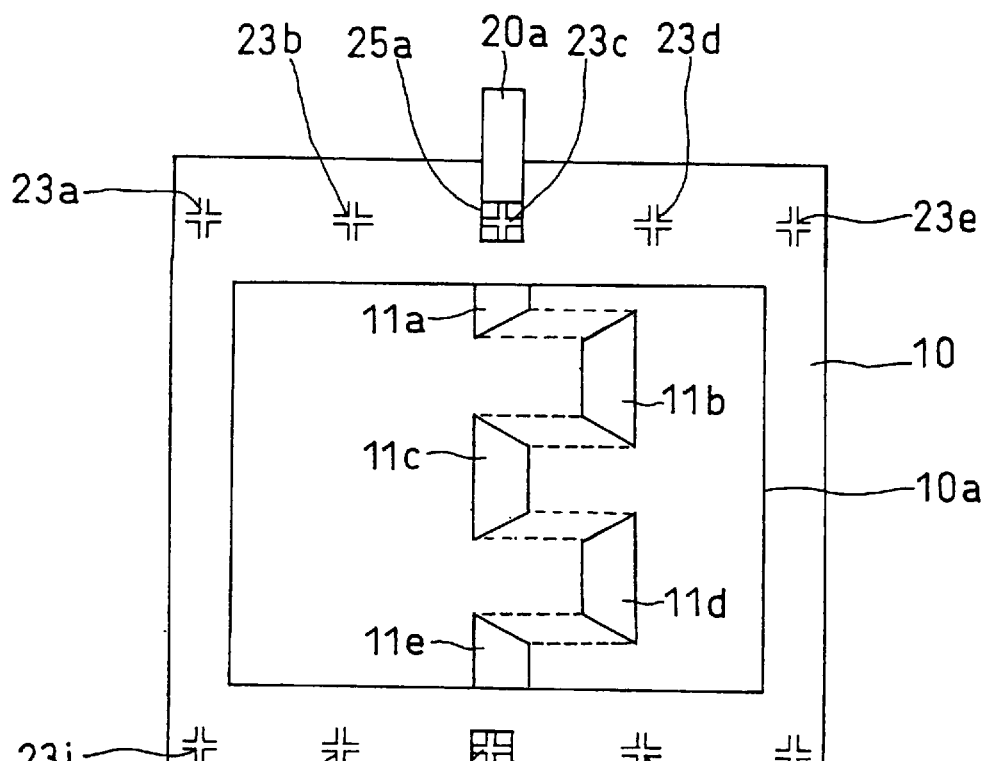
FIG. 7 is a top plan view of a mask.
Figure 7:
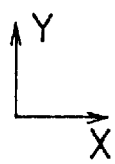

FIG. 7 shows the upper surface of the mask 10, on which a pattern region 10a with a pattern to be transcribed onto the photosensitive substrate 14 is formed. The mask 10 is provided with alignment marks (mask marks) 23a to 23j which are formed in a peripheral region outside the pattern region 10a so as to conform with the substrate marks 24a to 24j of the photosensitive substrate 14. As clearly seen from FIG. 7, the dimension in the direction of Y of the pattern region 10a formed on the mask 10 in this case is made larger than the dimension in the direction of Y of the illuminating regions 11a to 11e.

As shown in FIGS. 1 and 7, alignments systems 20a and 20b are disposed over the mask 10, thereby making it possible, by making use of these alignment systems 20a and 20b, to detect not only the mask marks 23a to 23j formed on the mask 10 but also the substrate marks 24a to 24j of the photosensitive substrate 14 through the optical projecting systems 12a and 12e. More specifically, an illuminating beams emitted from these alignment systems 20a and 20b are irradiated not only onto the mask marks 23a to 23j formed on the mask 10 via the reflection mirrors 25a and 25b, but also onto the substrate marks 24a to 24j of the photosensitive substrate 14 via the optical projecting systems 12a and 12e which are disposed on both end portions of the array of optical projecting a systems 12a to 12e.

The reflected beams from the substrate marks 24a to 24j of the photosensitive substrate 14 are introduced via the optical projecting systems 12a and 12e and via the reflection mirrors 25a and 25b into the alignment systems 20a and 20b, respectively. Likewise, the reflected beams from the mask marks 23a to 23j formed on the mask 10 are introduced via the reflection mirrors 24a and 25b into the alignment systems 20a and 20b, respectively. The alignment systems 20a and 20b are designed so as to detect, on the basis of the reflected beams from the mask 10 and the photosensitive substrate 14, the position of each of the alignment marks.

Figure 8:
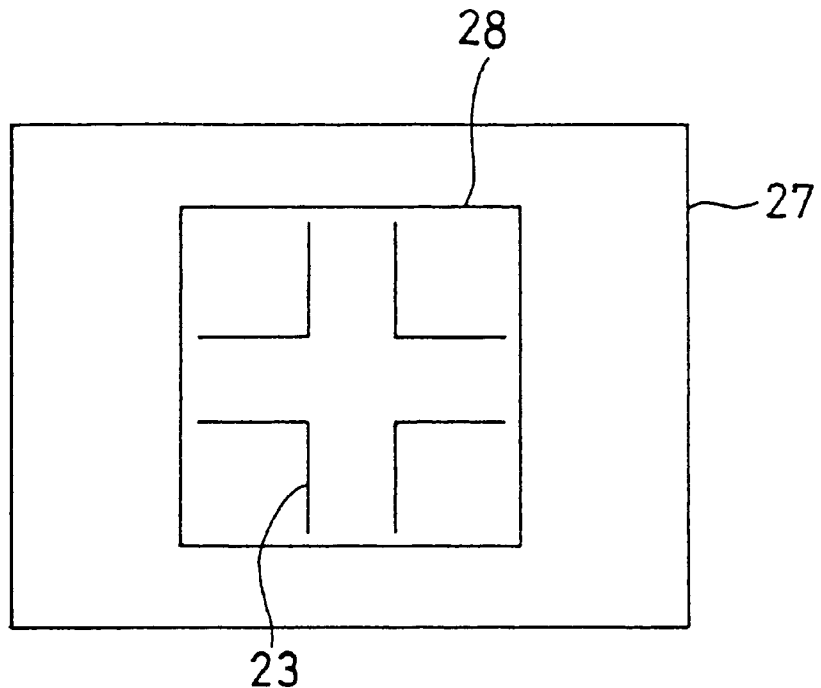
FIG. 8 shows a diagram illustrating a mask mark which is reproduced by an alignment system.

FIG. 8 illustrates the image transcribed from the mask mark 23, which has been obtained when the alignment systems 20a and 20b are constructed such that each of them is provided with A CCD camera and the position of mark is determined by way of image processing. The reference number 27 represents the observation field of the alignment system and 28 represents an index mark which is attached inside the alignment systems 20a and 20b. After shifting the mask stage 20 or the substrate stage 15 by a predetermined distance in the direction of X, the substrate marks 22a and 22b of the substrate stage 15 as well as the mask marks 23a to 23j formed on the mask 10 are concurrently detected by making use of the alignment systems 20a and 20b, thereby making it possible to clearly coordinate the position coordinates of the substrate stage 15 with the position coordinates of the mask 10. If required, the position of the mask 10 may be controlled by slightly shifting the mask stage 20 by making use of the X-direction position-measuring apparatus 19X and the Y-direction driving device 18Y.

Figure 9:
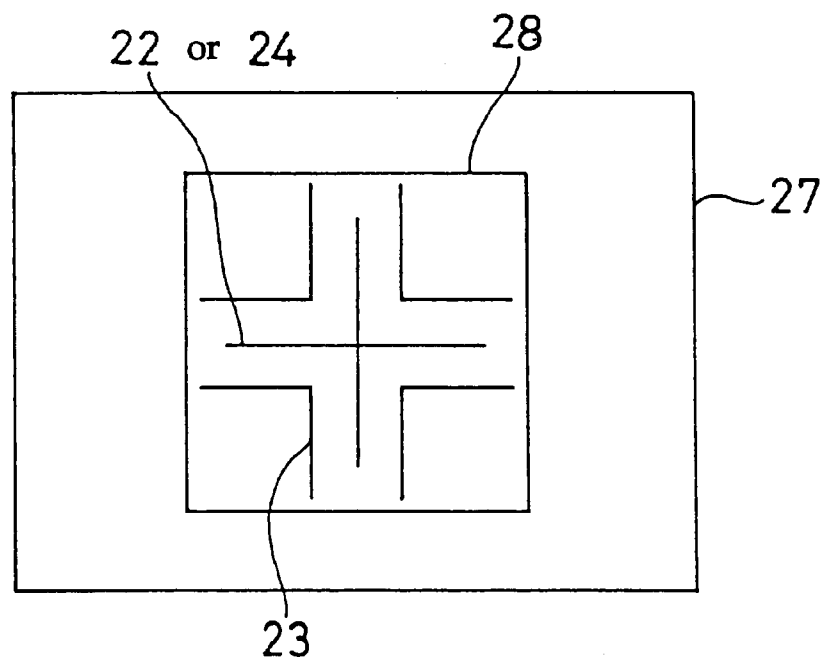
FIG. 9 shows a diagram illustrating a mask mark which is reproduced by an alignment system.

FIG. 9 illustrates the image transcribed concurrently from the mask mark 23 and the substrate mark 24, which has been obtained by making use of the alignment systems 20a and 20b. These alignment systems 20a and 20b are enabled, through the management of position of the index mark 28 relative to the substrate mark 22 formed on the substrate stage 15, to be calibrated relative to the positioning reference of the substrate stage 15. Further, it is possible to detect the relative position between the photosensitive substrate 14 and the mask 10 by concurrently detecting the substrate marks 24a to 23j of the photosensitive substrate 14 and the mask marks 23a to 23j formed on the mask 10 by making use of the alignment systems 20a and 20b while allowing the mask stage 20 and the substrate stage 15 to move in the direction of X.

Referring to FIG. 1, the controlling device 50 which is designed to entirely control the scanning exposure apparatus is constructed such that the measured results of the position-measuring apparatuses 17X, 17Y, 19X and 19Y as well as the output from the alignment systems 20a and 20b are supplied therewith, and at the same time, a controlling signal for controlling the image-forming characteristic-adjusting mechanisms 120a to 120e inside each of the optical projecting systems 12a to 12e is transmitted therefrom.

More specifically, the controlling device 50 is constructed such that it is constituted by a microcomputer, etc., and provided with a memory device 51, so that it is possible with this controlling device 50 to determine the non-linear components of error through the detection of the alignment marks, to perform the calculation for correcting the shifting mechanism in the non-scanning direction of the image-forming optical system as well as the magnification-correcting mechanism thereof, and to output a controlling signal to each of the image-forming characteristic-adjusting mechanisms 120a to 120e so as to perform the correction of the non-linear shift component in the non-scanning direction as well as the magnification components.

Namely, the controlling device 50 is enabled, on the basis of the detected results that have been output from the alignment systems 20a and 20b, not only to perform the corrections of shift and rotation in the same manner as the conventional device, but also to grasp the configuration of the photosensitive substrate 14 so as to determine the value of correcting the change in configuration of the photosensitive substrate 14 relative to the scanning direction, the correction value thus determine being stored in the memory device 51. This controlling device 50 is also designed to control the image-forming characteristic adjusting mechanism 120 of each of the optical projecting systems 12a to 12e depending on the aforementioned correction value.

The memory device 51 is constituted by ROM, RAM and EEPROM (electrically erasable programmable ROM) which is electrically reloadable non-volatile memory, and is capable of storing the program of the controlling device 50, the controlling data for the scanning exposure, and the data related to the non-linear component of error.

Next, the operation of the scanning exposure apparatus constructed as mentioned above will be explained. First of all, the basic principle of the present invention will be discussed.

The photosensitive substrate 14 transferred to this scanning exposure apparatus so as to be subjected to an exposure processing is subjected to a plurality of heat treatments and also to a repetition of the exposure of original picture pattern to the plural layers thereof in the course of the processing. Mainly due to the heat treatments in the processing, the configuration of the photosensitive substrate 14 is caused to change as a result of the expansion and shrinkage of the photosensitive substrate 14.

Figure 10:
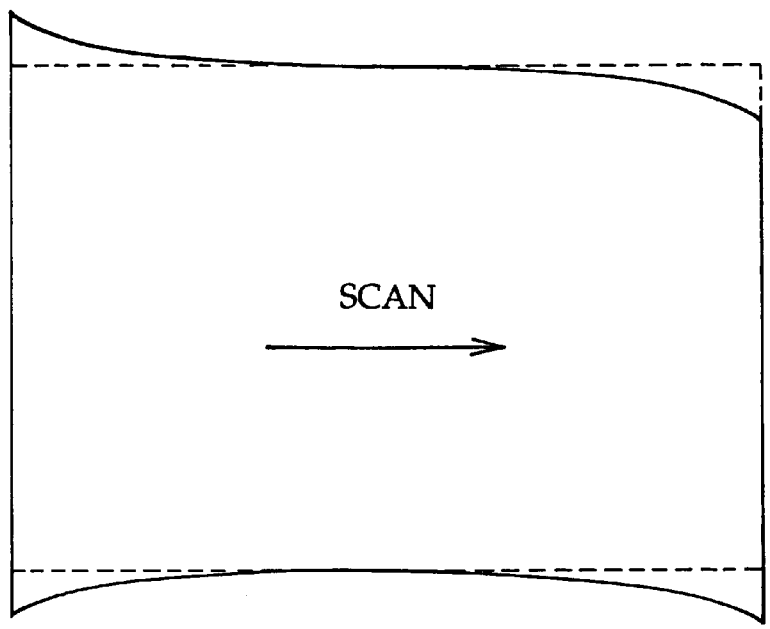
FIG. 10 is a plan view showing one example of deformation of a photosensitive substrate.

FIG. 10 shows one example of deformation of the photosensitive substrate 14, wherein the rectangular portion indicated by a broken line represents an ideal photosensitive substrate, while the configuration indicated by a solid line represents a photosensitive substrate that has been curvedly deformed due to various treatments. Other than that shown in FIG. 10, there would be various examples of deformation such as a barrel shape, a bobbin shape, a crescent shape, etc. When an exposure is tried to made on such a deformed photosensitive substrate, the magnitude of deformation in the X-direction (scanning direction) as well as in the Y-direction which is perpendicular to the X-direction in the exposure operation is caused to gradually change, so that it is impossible to sufficiently correct the alignment by simply executing the correction of shift, the correction of rotation, or the correction of scale.

The present invention has been made taking notice of the fact that the deformation of the photosensitive substrate is non-linear, so that the non-linear component of the exposure error in the scanning direction is determined at first, and then, stored in advance as a correction value. Thereafter, based on this correction value, the image-shifting mechanism in the scanning direction of the optical projecting system is successively controlled in executing the exposure of a pattern.

Figure 11:
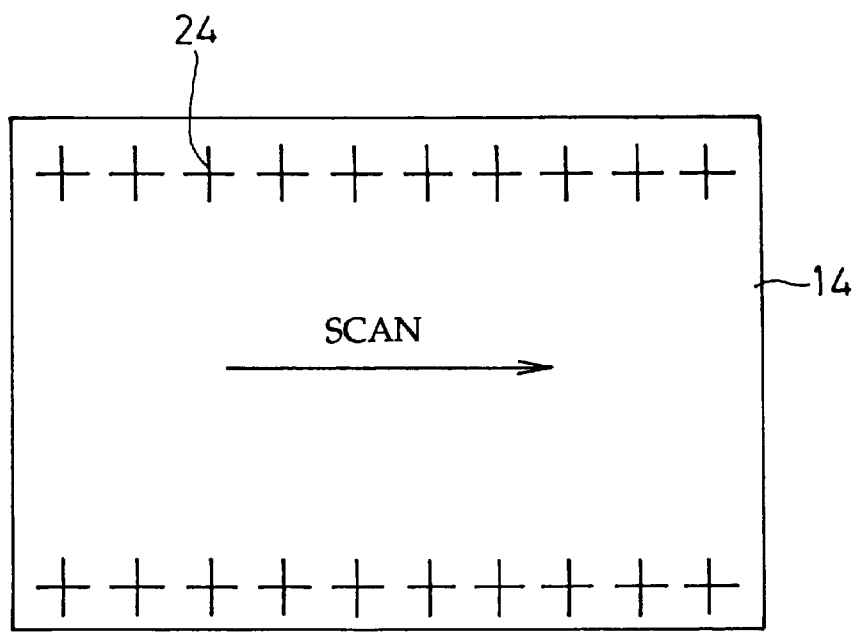
FIG. 11 is a plan view showing one example of the arrangement of substrate marks.

Therefore, the non-linear component of the error is determined in advance through the detection of the alignment marks. Then, the shifter portion 42 (shifting mechanism) in the non-scanning direction of the optical projecting systems (image-forming optical system) 12a to 12e as well as the magnification controlling portion (magnification correcting mechanism) 45 are controlled by means of the controlling device 50 so as to correct the non-linear shift component in the non-scanning direction as well as the magnification component. For the purpose of calculating the non-linear component, the substrate marks (lap measuring marks) 24 for measuring the accuracy of register may be disposed as shown in FIG. 11.

In this case, instead using the aforementioned substrate marks 24, verniers for measuring the accuracy of register may be formed on the surface of the photosensitive substrate 14. The vernier is formed of a combination of a main graduation and a sub-graduation finely dividing the space between steps of the main graduation. It is possible to find out the magnitude of deformation of the photosensitive substrate 14 by reading an aligned point between these main and sub-graduations. Alternatively, it is also possible to adopt a method wherein the exposure pattern (for example, an electrode portion of a transistor for driving a light emitting element) that has been produced on the surface of the photosensitive substrate 14 may be directly read out, and the result thus read out is then subjected to an image processing so as to determine the magnitude of deformation of the photosensitive substrate 14. This method is applicable not only to the configuration shown in FIG. 10, but also to other configurations of non-linear component such as a barrel shape, a bobbin shape, a crescent shape, etc.

Next, one example of a sequence for registering a correction value of that exposure error according to the aforementioned fundamental idea will be explained.

Figure 12:
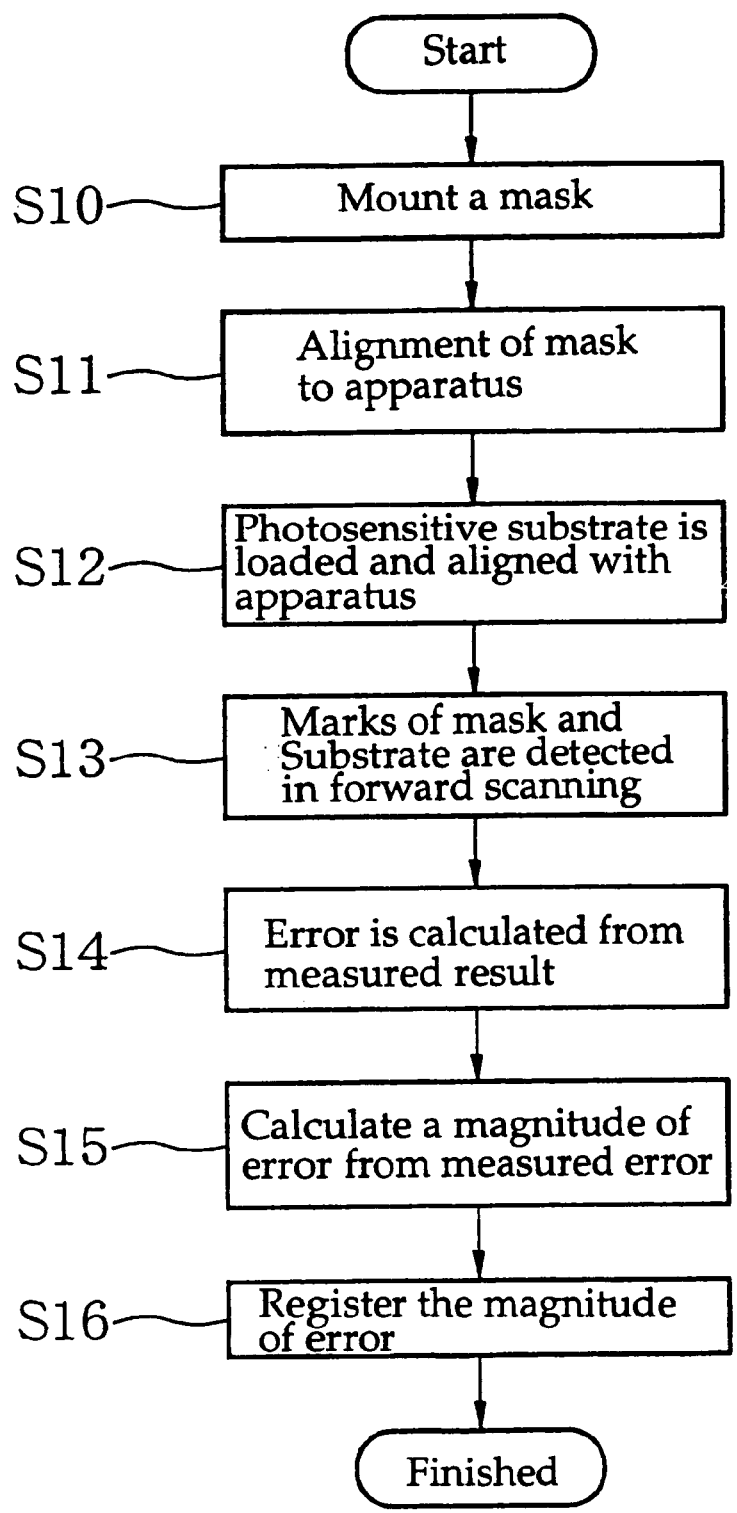
FIG. 12 is a flow chart illustrating the process of registering non-linear components of exposure error in the scanning direction.

FIG. 12 is a flow chart illustrating the process of registering non-linear components of exposure error in the scanning direction. This flow is executed by making use of the controlling device 50 prior to the ordinary exposure treatment. In FIG. 12, the symbol S denotes each step of the flow.

It is required, in the formation of an active element in a liquid crystal panel of active matrix type, to execute an exposure step by superimposing a plurality of pattern layers with each other. Therefore, it is assumed that if the manufacturing step is altered, the non-linear component of exposure error is also caused to alter. Accordingly, it is preferable to perform the exposure treatment by way of this flow and to register a correction value every moment of processing a photosensitive substrate to be subjected to an exposure process.

First of all, at step S10, the mask 10 is mounted. By the way, this mask 10 and the photosensitive substrate 14 to be subjected to an exposure process as described below are both provided with a measuring pattern (in this case, an alignment mark) which enables the non-linear component of exposure error to be accurately detected. By the way, in place of the mask 10 and the photosensitive substrate 14 which are provided respectively with aforementioned specific measuring pattern, it is also possible to employ a structure wherein an exposure pattern formed on the surface of the photosensitive substrate 14 can be directly read out and then, the position of mark is determined by undergoing an image processing.

Then, at step S11, by making use of the alignment systems 20a and 20b which are held by a holding member on which the optical projecting systems 12a to 12e are also mounted, the flesh mask 10 is positioned relative to the exposure apparatus. As explained with reference to FIG. 9, this positioning is performed in such a way that the mask marks 23a and 23j are detected at first by the alignment systems 20a and 20b, and then, the position of the mask mounted on the mask stage 20 is adjusted by a driving means (not shown) so as to allow the mask marks to be placed at a predetermined position relative to the index marks 28.

Then, at step S12, the photosensitive substrate 14 to be exposed for the measurement is loaded on the substrate stage 15 by means of a substrate loader (not shown), and the photosensitive substrate 14 thus loaded is positioned relative to the exposure apparatus. More specifically, in the same manner as in the case of the alignment of the mask 10 at the step S11, the substrate marks 24a and 24j are detected at first by the alignment systems 20a and 20b, and then, the positioning of the photosensitive substrate 14 is performed by the controlling of a driving means (not shown) mounted on the substrate stage 15 so as to allow the substrate marks 24a and 24j to be placed at a predetermined position relative to the index marks 28.

At the step S13, the X-direction driving device 18X of the mask stage 20 and the X-direction driving device 16X of the substrate stage 15 are employed to drive the mask stage 20 and the substrate stage 15 to move in the direction of −X for instance, thereby enabling the mask 10 and the photosensitive substrate 14 to perform a synchronous forward scanning relative to the optical projecting systems 12a to 12e. On this occasion, by means of one alignment system 20a, the relative position between the mask marks 23a to 23e and the substrate marks 24a to 24e is detected. The other alignment system 20b functions to detect the relative position between the mask marks 23f to 23j and the substrate marks 24f to 24j. These relative positions between the mask marks 23a to 23e and 23f to 23j and the substrate marks 24a to 24e and 24f to 24j thus detected are stored in the memory device 51.

When the detection of alignment marks is finished, the process is advanced to the step S14 wherein the measurement error of the photosensitive substrate 14 relative to the mask 10 is calculated at every predetermined pitch on the basis of the measured result. This measuring point is set at the position and the pitch which enable the non-linear component of the exposure error of the photosensitive substrate 14 to be suitably detected. In this case, the aforementioned measuring point may be set at any desired pitch depending on the manufacturing process and on the accuracy of register of the exposure pattern. When the method wherein an exposure pattern formed on the surface of the photosensitive substrate 14 is directly read out and then, the result thus read out is subjected to an image processing to determine the magnitude of deformation of the photosensitive substrate 14 is employed, the control device 50 can be immediately executed after finishing the measurement.

Figure 13:
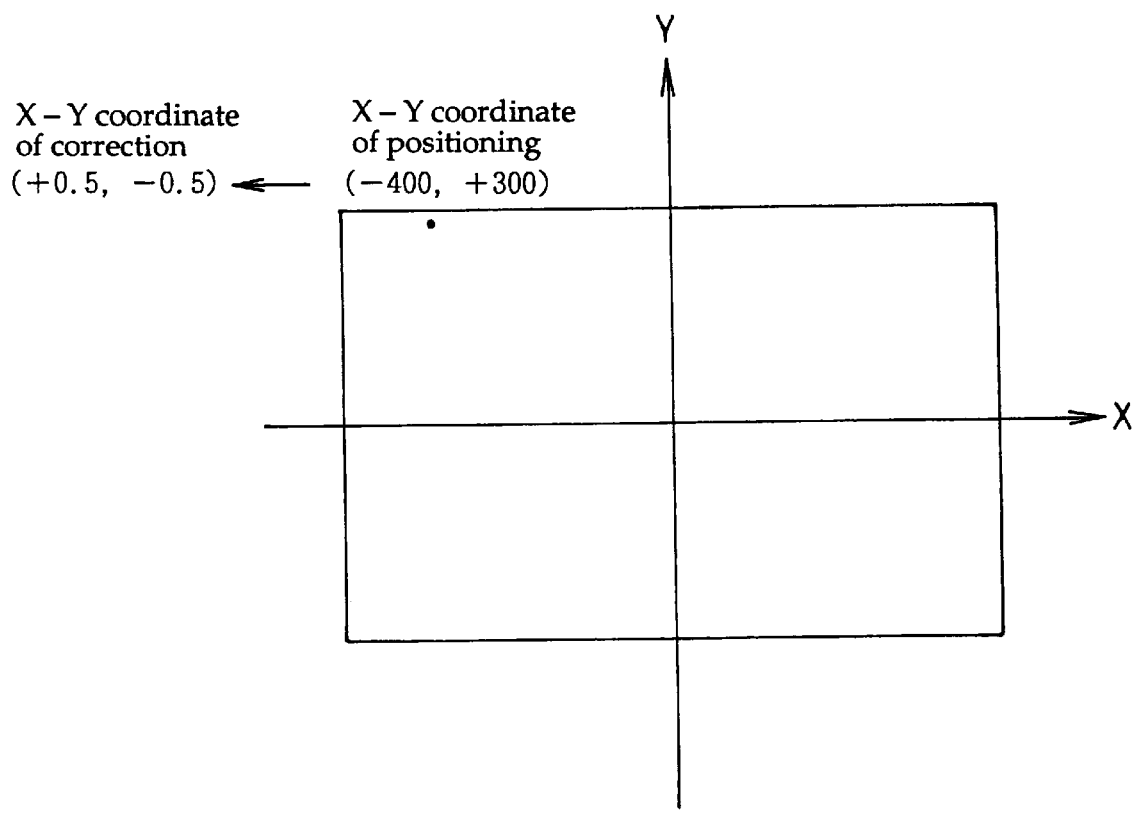
FIG. 13 shows a diagram illustrating the calculation of the magnitude of correction.

At the step S15, the non-linear component of the photosensitive substrate 14 is determined from the measurement error, and then, the magnitude of correction for eliminating this non-linear component is calculated. For example, when the X-Y coordinate of a measurement point on the surface of the photosensitive substrate 14 is assumed to be represented by (−400, +300) as shown in FIG. 13, and if the measured result is deviated from this X-Y coordinate (−400, +300), the values of X-Y coordinate corresponding to this deviation (for example, +0.5, −0.5) are calculated as correction values.

Then, at the step S16, this magnitude of correction is registered as a correction factor for the exposure apparatus in the memory device 51, thus finishing the flow.

As explained above, after finishing the ordinary linear correction, each error of the measurement point (X-direction as well as Y-direction) is calculated and then, registered as an exposure data in the memory device.

Namely, at the step S13, the alignment between the mask 10 and the photosensitive substrate 14 is performed, and then, the magnitude of shifting in the X-direction, the Y-direction and the rotational direction are determined by way of the least square method, etc. so as to minimize the error of relative position between the mask marks 23a to 23j that have been stored in the memory device 51 and the substrate marks 24a to 24j corresponding to these mask marks 23a to 23j. Then, based on the magnitude of shifting thus determined, the position of the mask 10 on the mask stage 20 is adjusted by a driving means (not shown) to thereby perform the linear correction. Thereafter, any magnitude of non-linear component of the photosensitive substrate 14 that is still left uncorrected even after the aforementioned linear correction is determined and then, registered as a correction factor in the memory device 51.

Next, the exposure operation of the scanning exposure apparatus will be explained.

As for the manner of correction, it can be performed by correcting the shifting mechanism in the non-scanning direction of each of the image-forming optical system and also by correcting the magnification correcting mechanism. A target position of the shifting mechanism in the non-scanning direction of each of the image-forming optical system as well as of the magnification correcting mechanism is calculated at each scanning position on the basis of the data thus registered, and then, these mechanisms are actuated during the scanning exposure.

FIGS. 14 and 15 shown the sequence of correcting the non-linear component, wherein M1 to M5 shown therein represent the projection regions of five optical projecting systems (image-forming optical system) 12a to 12e. Further, just like FIG. 10, the photosensitive substrate 14 is depicted in the form of an ideal photosensitive substrate which is free from any deformation (indicated by a broken line) as well as in the form of a deformed photosensitive substrate which is curvedly deformed (indicated by a solid line).

Figure 14A:
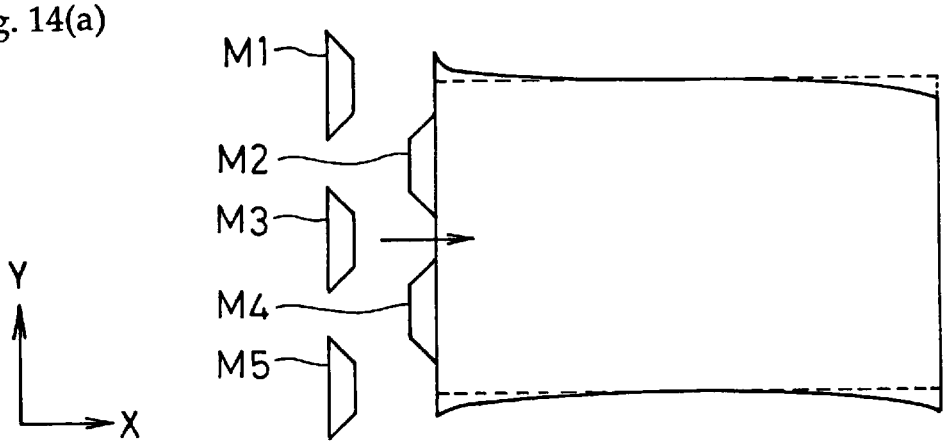
FIG. 14 shows a diagram illustrating the sequence of correction of non-linear components (No. 1)

FIG. 14(a) shows a starting stage of exposure wherein the exposure of the projection regions M2 and M4 constituting the first projection row among five projection regions M1 to M5 are going to be initiated. At this stage, the shifting mechanism in the non-scanning direction as well as the magnification correcting mechanism of each of the projection regions M2 and M4 are controlled according to the correction values (correction factors) that have been registered in the memory device 51. More specifically, the shifter portion (shifting mechanism) 42 and the magnification adjusting portion (magnification correcting mechanism) 45 of the image-forming characteristic adjusting mechanism 120 of each of the optical projecting systems 12b and 12d constituting the first projection row are controlled by the controlling device 50.

Figure 14B:
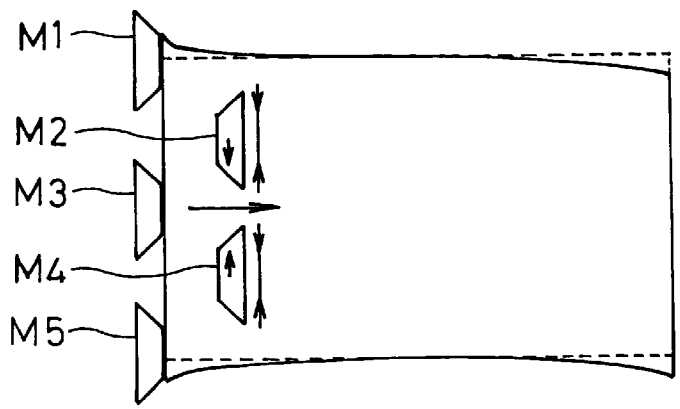

FIG. 14(b) shows a stage wherein the exposure of the projection regions M1, M3 and M5 constituting the second projection row are going to be initiated. At this stage, the projection regions M2 and M4 are exposed at the position which is located ahead by a distance corresponding to the space between the lens of M1, M3 and M5 and the lens of M2 and M4. In the case of M1, M3 and M5 also, the shifter portion (shifting mechanism) 42 and the magnification adjusting portion (magnification correcting mechanism) 45 are controlled by the controlling device 50 in the same manner as in the case of correcting the M2 and M4. In this case, the shifting mechanism in the non-scanning direction and magnification correcting mechanism of M1, M3 and M5 are driven to move to a target position in the state of FIG. 14(b), i.e. to the position which leads to the correction of M2 and M4 shown in FIG. 14(a). In this manner, the correction values of M1, M3 and M5 are always driven targeting the correction values of coordinate which are delayed relative to M2 and M4 by the space between these rows of lens. When the correction is performed in this manner, it is possible to realize an optimum non-linear correction for the apparatus which is provided with image-forming optical systems differing in intervals of lens thereof.

The arrows shown in the vicinity of M2 and M4 indicate that the correction values for the controlling for minimizing the magnification at that position have been already registered, while the arrows shown inside M2 and M4 indicate that the correction values for performing the shift control in the direction of arrow at that position have been already registered. By the way, the length of arrow schematically represents the magnitude of correction of the correction value.

At this moment, when M2 and M4 are placed at this position, the photosensitive substrate (the solid line portion) is slightly deformed relative to the ideal photosensitive substrate (the broken line portion) which is free from deformation. The correction value for shrinking these M2 and M4 and at the same time, for shifting in the direction of the arrow are registered in the memory device 51. When the shifting mechanism and the magnification correcting mechanism are controlled according to this correction value by the controlling device 50 (in this case, it is controlled such that the magnification is reduced and the regions are shifted toward the center of the photosensitive substrate), these M2 and M4 are corrected in the direction of the arrows shown inside these M2 and M4.

Figure 14C:
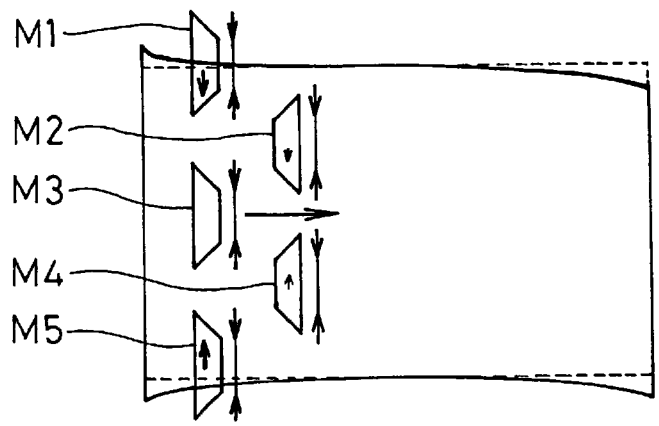

FIG. 14(c) shows a stage wherein M1, M3 and M5 are driven up to the position of M2 and M4 shown in FIG. 14(b). The correction value of M1, M3 and M5 in this case becomes such that corresponds to the correction value employed for correcting M2 and M4 in FIG. 14(b). Therefore, on the basis of the correction value of the projection regions M1, M3 and M5, the shifting mechanism and the magnification correcting mechanism are controlled by the controlling device 50 (in this case, it is controlled such that the magnification is reduced and the regions are shifted toward the center of the photosensitive substrate) so as to correct M1 and M5 out of these M1, M3 and M5 in the direction of the arrows shown inside these M1 and M5.

At this moment, the M2 and M4 preceding the M1, M3 and M5 are moved close to the center of the photosensitive substrate, thus reaching a position where the magnitude of deformation is further minimized as compared with the deformation indicated with reference to FIG. 14(b). At this position, the correction value where the magnification and the quantity of shift are reduced as compared with those of the correction value of FIG. 14(b) is registered. Then, the shifting mechanism and the magnification correcting mechanism are controlled according to this correction value by the controlling device 50 (in this case, it is controlled such that the magnification is reduced and the regions are shifted toward the center of the photosensitive substrate), thereby correcting these M2 and M4 in the direction of the arrows shown inside these M2 and M4.

Figure 15A:
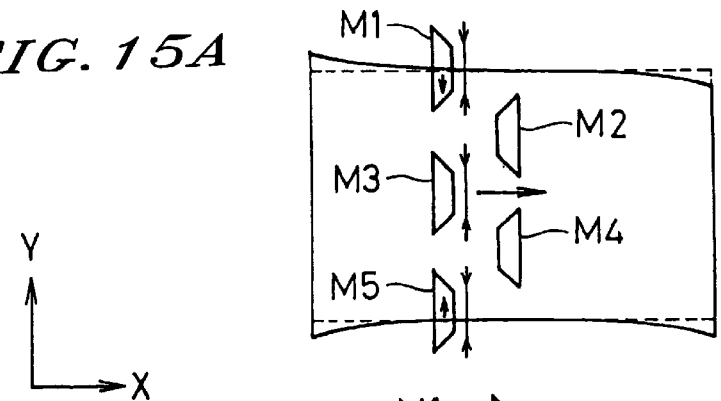
FIG. 15 shows a diagram illustrating the sequence of correction of non-linear components (No. 2)

FIG. 15(a) shows a stage wherein M1, M3 and M5 are driven up to the position of M2 and M4 shown in FIG. 14(c). The correction value of M1, M3 and M5 in this case becomes such that corresponds to the correction value employed for correcting M2 and M4 in FIG. 14(c). Therefore, on the basis of the correction value of the projection regions M1, M3 and M5, the shifting mechanism and the magnification correcting mechanism are controlled by the controlling device 50 so as to correct M1 and M5 out of these M1, M3 and M5 in the direction of the arrows shown inside these M1 and M5. At this moment, the M2 and M4 at this location are made free from any deformation of the photosensitive substrate, and hence the correction value thereof is zero. Therefore, the correction of M2 and M4 would not be performed.

Figure 15B:
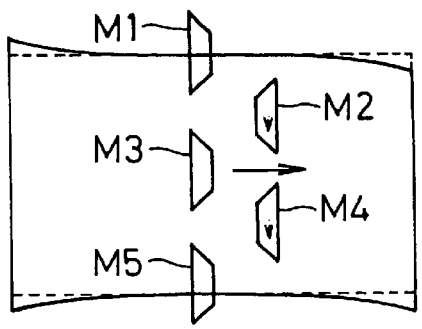

FIG. 15(b) shows a stage wherein M1, M3 and M5 are driven up to the position of M2 and M4 shown in FIG. 15(a) or the central portion of the photosensitive substrate. Since there is no deformation of the photosensitive substrate, the correction of M1, M3 and M5 would not be performed. At this moment, M2 and M4 are placed close to the terminal position of the scanning of photosensitive substrate, and when M2 and M4 are placed at this position, the photosensitive substrate (the solid line portion) is slightly deformed in the direction of −Y (lower side in the non-scanning direction, i.e. downward in this FIG.) relative to the ideal photosensitive substrate (the broken line portion) which is free from deformation, so that the correction value for shifting these M2 and M4 in the direction of −Y has been already registered in the memory device 51. When the shifting mechanism is controlled in the direction of −Y according to this correction value by the controlling device 50, these M2 and M4 are corrected in the direction of the arrows shown inside FIG. 15(b).

Figure 15C:
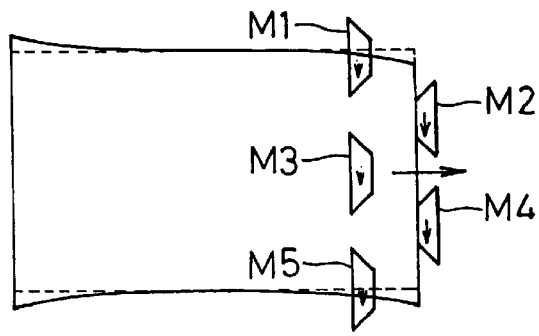

FIG. 15(c) shows a stage wherein M1, M3 and M5 are driven up to the position of M2 and M4 shown in FIG. 15(b). The correction value of M1, M3 and M5 in this case becomes such that corresponds to the correction value employed for correcting M2 and M4 in FIG. 15(b). Therefore, on the basis of the correction value of the projection regions M1, M3 and M5, the shifting mechanism is controlled by the controlling device 50 (in this case, the shifting mechanism is controlled in the direction of -Y) so as to correct M1, M3 and M5 in the direction of the arrows shown inside the M1 and M5. At this moment, M2 and M4 are placed close to the terminal position of the scanning of the photosensitive substrate, and when M2 and M4 are placed close to the terminal position of the scanning of photosensitive substrate, and when M2 and M4 are placed at this position, the photosensitive substrate (the solid line portion) is greatly deformed in the direction of −Y relative to the ideal photosensitive substrate (the broken line portion) which is free from deformation, so that the correction value for shifting these M2 and M4 in the direction of −Y has already been registered in the memory device 51. When the shifting mechanism is controlled in the direction of −Y according to this correction value by the controlling device 50, these M2 and M4 are corrected in the direction of the arrows shown inside FIG. 15(c).

Figure 15D:
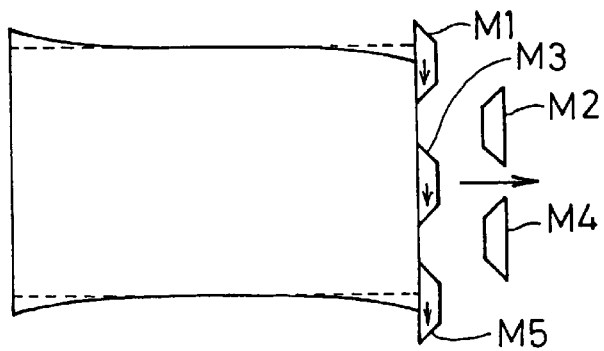

Finally, FIG. 15(d) shows a stage wherein M1, M3 and M5 are driven up to the position of M2 and M4 shown in FIG. 15(c). The correction value of M1, M3 and M5 in this case becomes such that corresponds to the correction value employed for correcting M2 and M4 in FIG. 15(b). Therefore, on the basis of the correction value of the projection regions M1, M3 and M5, the shifting mechanism is controlled by the controlling device 50 (in this case, the shifting mechanism is controlled in the direction of -Y) so as to correct M1, M3 and M5 in the direction of the arrows shown inside the M1 and M5. At this moment, the exposure of M2 and M4 is finished, so that the controlling of the shifting mechanism and magnification correcting mechanism is no more performed.

As explained above, the non-linear component of exposure error in the scanning direction is registered in advance as a correction value, and hence, on the basis of this correction value, the image shifting mechanism and the magnification correcting mechanism in the scanning direction of the optical projection systems M1 to M5 can be successively controlled. In FIGS. 14 and 15, the correction of the optical projection systems M1 to M5 at a representative position is explained. As a matter of fact however, the number of correction value registered in conformity with the position of exposure is larger than that explained above, and at the same time, the magnitude of shift and magnification differ from each other depending on specific position. Further, the optical projection systems M1 to M5 are respectively provided therein with an image-forming characteristic adjusting mechanism 120 which is constituted by a shifter portion (shifting mechanism) 41, a magnification adjusting portion (magnification adjusting mechanism) 45, and a rotation correcting portion (rotation correcting mechanism) 43, and are individually and successively controlled by means of the controlling device 50.

By the way, in the prior art also, the shifting and rotation of a transcribed image depending on an error in orthogonality have been performed by making use of a plurality of optical projection systems, each provided with an image shift-, rotation- and magnification-adjusting mechanism comprising a mechanism for shifting a transcribed image in the direction of X and Y or in a rotational direction about the optical axis thereof, and a mechanism for adjusting the magnification of a transcribed image (see Japanese Patent Unexamined Publication H8-8172). However, the shifting and the rotation by means of this adjusting mechanism are solely aimed at performing a linear correction and also aimed at shifting or rotating the optical projection system of a first projection row as well as the optical projection system of a second projection row by making use of the aforementioned adjusting mechanism.

Whereas, in the case of the scanning exposure apparatus according to this embodiment, the change in configuration of photosensitive substrate including a non-linear component is registered in advance as a correction value, and on the basis of the correction value thus registered, the image-forming characteristic adjusting mechanism 120 in the scanning direction of each optical projection system is successively controlled on the occasion of executing a pattern exposure. For example, as shown in FIG. 15(a), while no correction is made on the M2 and M4, the M1 and M3 are corrected in such a way that the magnification thereof is reduced, and that the M1 and M3 are shifted toward the center of the substrate, and at the same time, a correction to only reduce the magnification is made on the M3. Moreover, this adjustment can be continuously controlled by making use of the control device 50. Therefore, it is now possible to perform the correction of the error originated from a non-linear component which has been failed to correct according to the conventional method to perform the linear correction of optical projection systems of the first and second projection rows.

Figure 16:
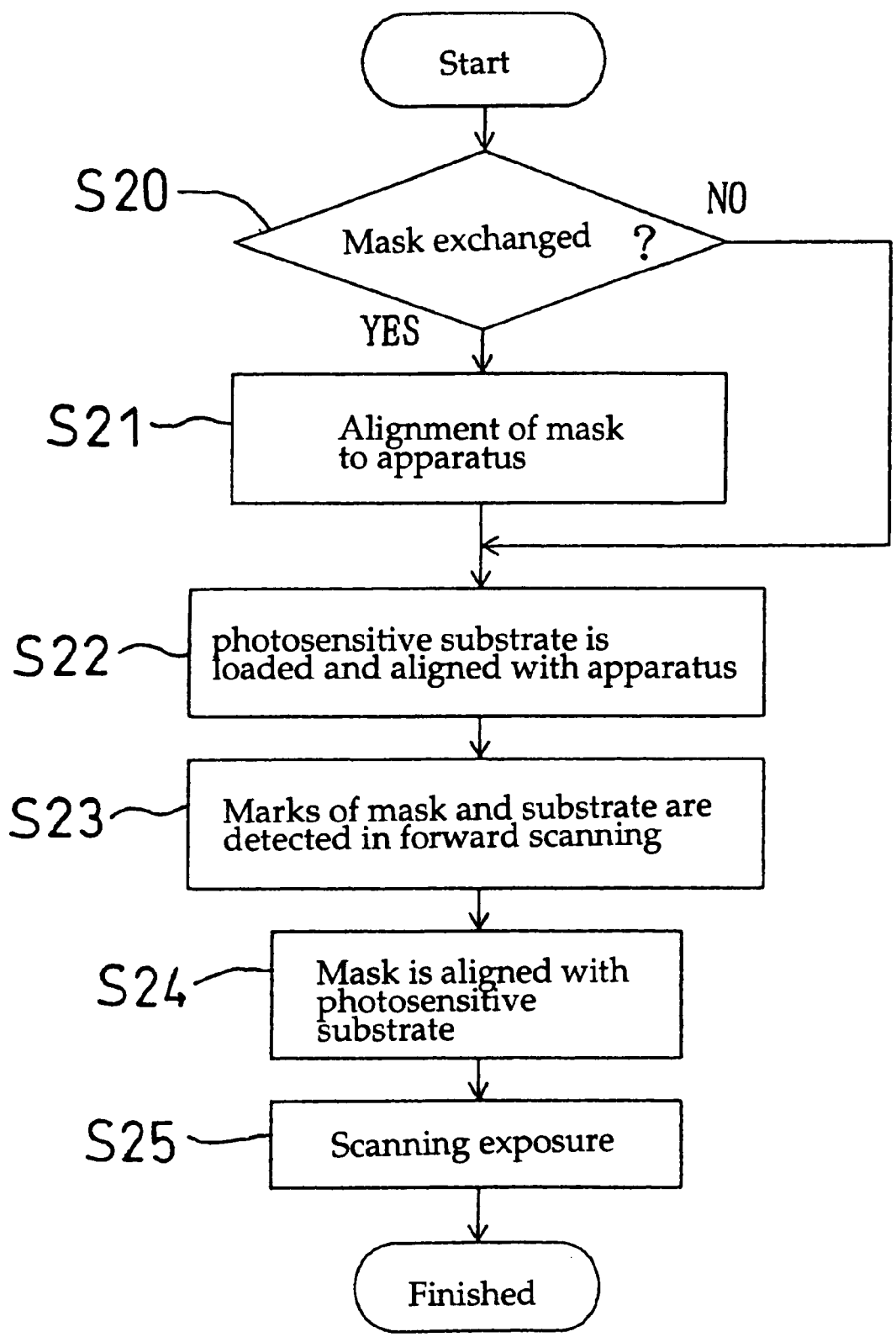
FIG. 16 is a flow chart illustrating the sequence of scanning exposure.

FIG. 16 is a flow chart illustrating the sequence of scanning exposure, wherein on the basis of the correction value that has been registered in advance, the image-forming characteristic adjusting mechanism 120 of the optical projection systems 12a to 12e is successively controlled on the occasion of executing a pattern exposure.

As explained above, it is required, in the formation of an active element in a liquid crystal panel of active matrix type, to execute an exposure step by superimposing a plurality of pattern layers with each other. Therefore, a plurality of masks 10 to be formed into an original plate are prepared, and then, a lap exposure of patterned layers is performed by exchanging the mask.

First of all, the mask 10 mounted on the mask stage 20 is exchanged by means of a mask loader (not shown). Namely, when the judgment of the step S20 is "YES", the process is advanced to the step S21, wherein by means of the alignment systems 20a and 20b held by a holding member sustaining the optical projection systems 12a to 12e, the flesh mask 10 is positioned relative to the exposure apparatus. As explained with reference to FIG. 9, this positioning is performed in such a way that the mask marks 23a and 23j are detected at first by the alignment systems 20a and 20b, and then, the position of the mask mounted on the mask stage 20 is adjusted by a driving means (not shown) so as to allow the mask marks to be placed at a predetermined position relative to the index marks 28. When the mask is not exchanged, this step S21 is omitted.

Then, at step S22, the photosensitive substrate 14 to be exposed is loaded on the substrate stage 15 by means of a substrate loader (not shown), and the photosensitive substrate 14 thus loaded is positioned relative to the exposure apparatus. More specifically, in the same manner as in the case of the alignment of the mask 10 at the step S21, the substrate marks 24a and 24j are detected at first by the alignment systems 20a and 20b, and then, the positioning of the photosensitive substrate 14 is performed by the controlling of a driving means (not shown) mounted on the substrate stage 15 so as to allow the substrate marks 24a and 24j to be placed at a predetermined position relative to the index marks 28.

At the step S23, the X-direction driving device 18X of the mask stage 20 and the X-direction driving device 16X of the substrate stage 15 are employed to drive the mask stage 20 and the substrate stage 15 to move in the direction of –X for instance, thereby enabling the mask 10 and the photosensitive substrate 14 to perform a synchronous forward scanning relative to the optical projecting systems 12a to 12e. On this occasion, by means of one alignment system 20a, the relative position between the mask marks 23a to 23e and the substrate marks 24a to 24e is detected. The other alignment system 20b functions to detect the relative position between the mask marks 23f to 23j and the substrate marks 24f to 24j. These relative positions between the mask marks 23a to 23e and 23f to 23j and the substrate marks 24a to 24e and 24j thus detected are stored in the memory device 51.

When the forward scanning of the mask 10 and the photosensitive substrate 14 is finished, the mask 10 is completely moved away from the illuminating regions 11a to 11e, and the photosensitive substrate 14 is also completely moved away from the projection regions 13a to 13e, thus offering the scanning initiating position, under which condition the alignment between the mask 10 and the photosensitive substrate 14 is performed. This alignment at the step S24 is performed in such a manner that the magnitude of shifting in the X-direction, the Y-direction and the rotational direction are determined by way of the least square method, etc. so as to minimize the error of relative position between the mask marks 23a to 23e and 23f to 23j that have been detected in the forward scanning in the step S23 and stored in the memory device 51 and the substrate marks 24a to 24e and 24f to 24j corresponding to these mask marks 23a to 23j. Then, based on the magnitude of shifting thus determined, the position of the mask 10 on the mask stage 20 is adjusted by a driving means (not shown).

Thereafter, the process is allowed to advance to the step S25, wherein the mask 10 and the photosensitive substrate 14 are synchronously scanned in the direction of +X (backward scanning) relative to the optical projecting systems 12a to 12e to thereby perform the scanning exposure.

During this scanning exposure, the image-forming characteristic adjusting mechanism 120 of each of the optical projecting systems 12a and 12e is continuously controlled respectively by the controlling device 50 on the basis of the correction value that has been registered in advance. Namely, the correction value for the corresponding photosensitive substrate is stored in advance in the memory device 51 through the exposure treatment and the correction value registration of the flow shown in FIG. 12. On the other hand, the controlling device 50 acts to read out the correction value for the corresponding photosensitive substrate from the memory device 51, thus controlling the shifting mechanism in the non-scanning direction and the magnification correcting mechanism of the optical projecting systems 12a to 12e. More specifically, on the basis of the correction value thus read out, the controlling device 50 calculate the target position of the shifting mechanism in the non-scanning direction and of the magnification correcting mechanism, thus driving these adjusting mechanisms during the scanning exposure. Further, referring to FIGS. 14 and 15, the shifting mechanism in the non-scanning direction and magnification correcting mechanism of M1, M3 and M5 are driven to move to a target position which leads to the correction of M2 and M4. In this manner, the correction values of M1, M3 and M5 are always driven targeting the correction values of coordinate which are delayed relative to M2 and M4 by the space between these rows of lens.

When the correction is performed in this manner, it is possible to realize an optimum non-linear correction for the apparatus which is provided with image-forming optical systems 12a to 12e differing in intervals of lens thereof. As a result, it becomes possible to perform the exposure of one continuous large pattern which is free from non-uniformity of exposure and wherein the projection areas derived from the optical projection areas 12b and 12d and the projection areas derived from the optical projection areas 12a, 12c, and 12e are overlapped with each other very precisely at the narrow regions thereof.

In the foregoing explanation, one example of performing the non-linear correction in the non-scanning direction has been set forth. In the followings however, one example of performing the non-linear correction in the scanning direction in the same manner as mentioned above will be explained.

Figure 17:
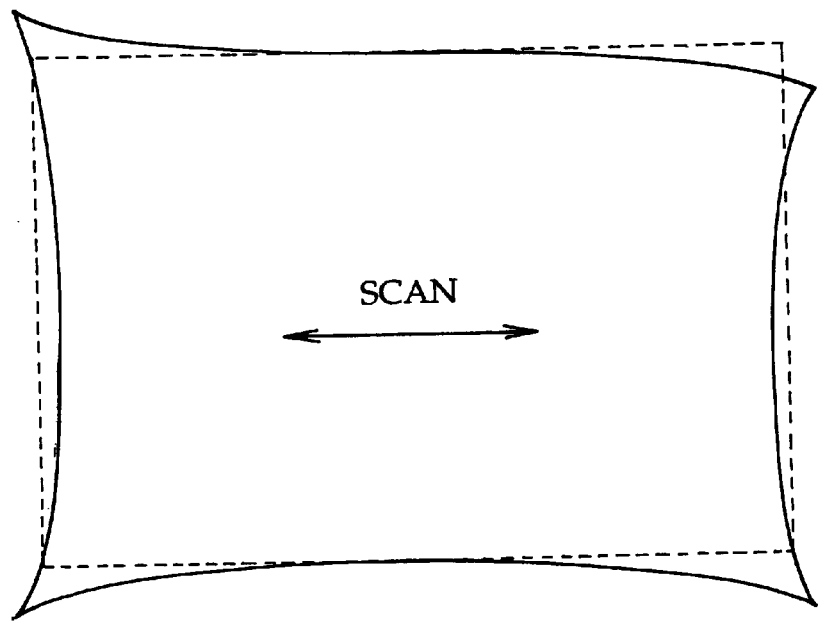
FIG. 17 is a plan view showing another example of deformation of a photosensitive substrate.

FIG. 17 shows one example of deformation of the photosensitive substrate 14, wherein the rectangular portion indicated by a broken line represents an ideal photosensitive substrate, while the configuration indicated by a solid line represents a photosensitive substrate that has been curvedly deformed in the scanning direction as well as in the non-scanning direction due to various treatments. Other than that shown in FIG. 17, there would be various examples of deformation such as a barrel shape, a bobbin shape, a crescent shape, etc. An exposure deviation to such a deformed photosensitive substrate will be corrected.

Figure 18:
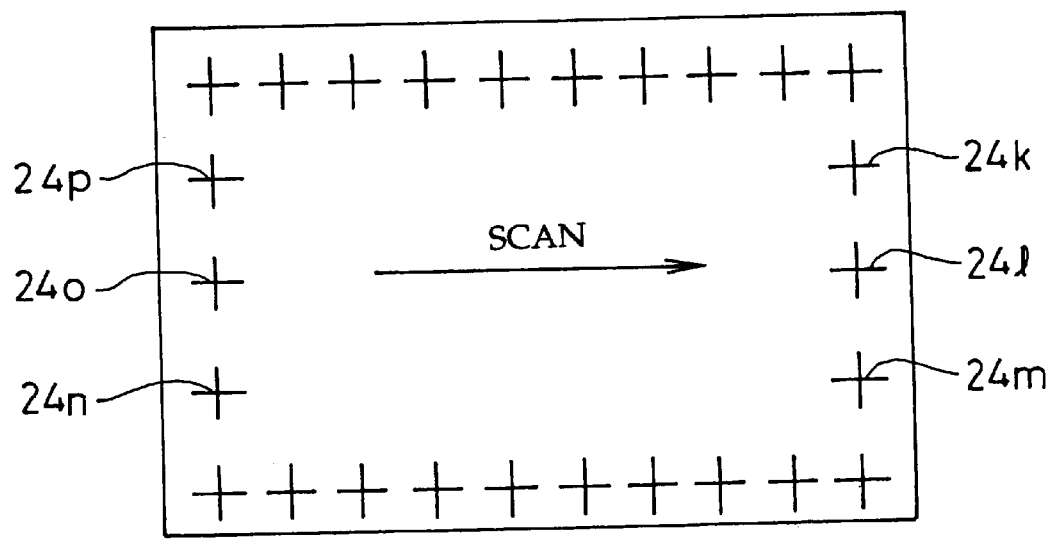
FIG. 18 is a plan view showing another example of the arrangement of substrate marks.

FIG. 18 shows a top plan view of the photosensitive substrate 14 which is mounted on the substrate stage 15. The photosensitive substrate 14 is provided with additional alignment marks (substrate marks) 24k to 24p which are arranged in the non-scanning direction and outside the exposure region 14a. Namely, for the purpose of calculating the non-linear component in the scanning direction in addition to the non-linear correction in the non-scanning direction, the substrate marks (lap measuring marks) 24k to 24p for measuring the accuracy of register at plural points are disposed as shown in FIG. 18, thereby adding the measuring points. In this case, instead using the aforementioned substrate marks 24a to 24p, verniers for measuring the accuracy of register at plural points may be formed on the surface of the photosensitive substrate 14.

FIGS. 19 and 20 show the sequence of correcting the non-linear component, which is the same as that of the first embodiment (FIGS. 14 and 15) except that the shifting mechanism in the scanning direction is controlled. Referring to FIGS. 19 and 20, M1 to M5 shown therein represent the projection regions of five optical projecting systems (image-forming optical system) 12a to 12e. Further, just like FIG. 17, the photosensitive substrate 14 is depicted in the form of an ideal photosensitive substrate which is free from any deformation (indicated by a broken line) as well as in the form of a deformed photosensitive substrate which is curvedly deformed in the scanning direction as well as in the non-scanning direction (indicated by a solid line).

Figure 19A:
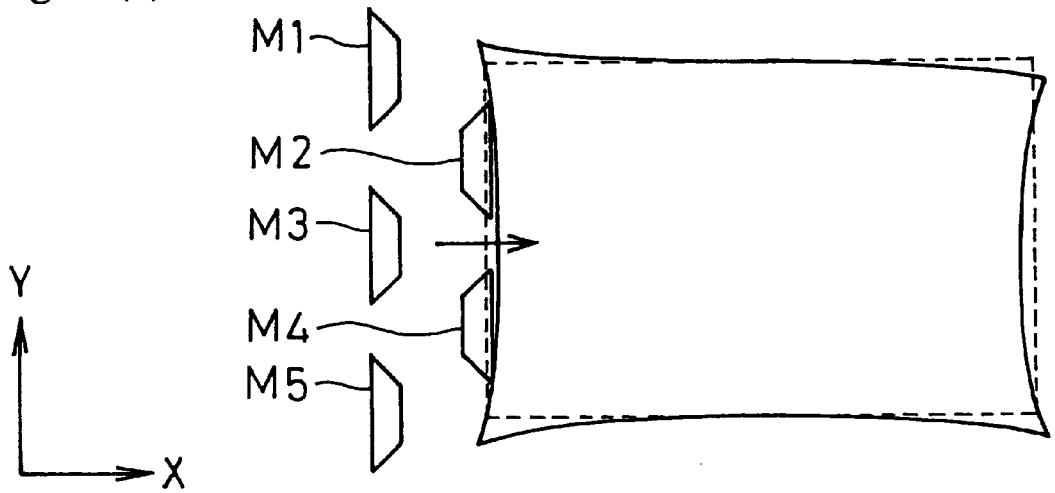
FIG. 19 shows a diagram illustrating the sequence of correction of non-linear components (No. 1)

FIG. 19(a) shows a starting stage of exposure wherein the exposure of the projection regions M2 and M4 constituting the first projection row among five projection regions M1 to M5 are going to be initiated. At this stage, the shifting mechanism in the non-scanning direction and in the scanning direction as well as the magnification correcting mechanism of each of the projection regions M2 and M4 are controlled according to the correction values (correction factors) that have been registered in the memory device 51. More specifically, the shifter portions (shifting mechanism) 41 and 42 and the magnification adjusting portion (magnification correcting mechanism) 45 of the image-forming characteristic adjusting mechanism 120 of each of the optical projecting systems 12b and 12d constituting the first projection row are controlled by the controlling device 50.

Figure 19B:
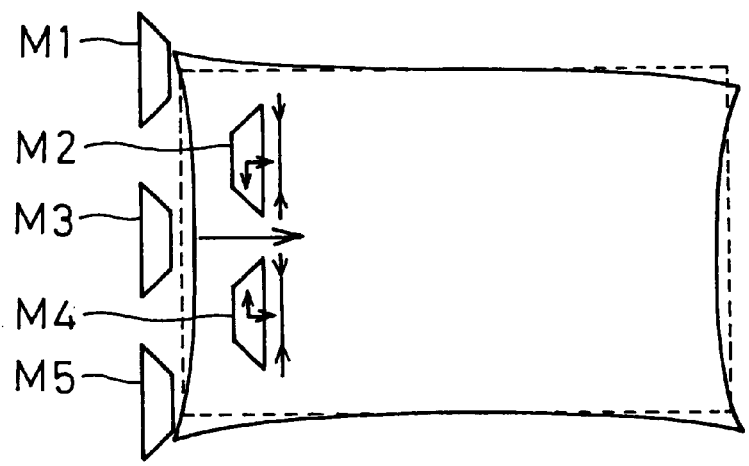

FIG. 19(b) shows a stage wherein the exposure of the projection regions M1, M3 and M5 constituting the second projection row are going to be initiated. At this stage, the projection regions M2 and M4 are exposed at the position which is located ahead by a distance corresponding to the space between the lens of M1, M3 and M5 and the lens of M2 and M4. In the case of M1, M3 and M5 also, the shifter portions (shifting mechanism) 41 and 42 and the magnification adjusting portion (magnification correcting mechanism) 45 are controlled by the controlling device 50 in the same manner as in the case of correcting the M2 and M4. In this case, the shifting mechanism in the non-scanning direction and in the scanning direction and magnification correcting mechanism of M1, M3 and M5 are driven to move to a target position in the state of FIG. 19(b), i.e. to the position which leads to the correction of M2 and M4 shown in FIG. 19(a). In this manner, the correction values of M1, M3 and M5 are always driven targeting the correction values of coordinate which are delayed relative to M2 and M4 by the space between these rows of lens. When the correction is performed in this manner, it is possible to realize an optimum non-linear correction for the apparatus which is provided with image-forming optical systems differing in intervals of lens thereof.

The arrows shown in the vicinity of M2 and M4 indicate that the correction values for the controlling for minimizing the magnification at that position have been already registered, while the arrows shown inside M2 and M4 indicate that the correction values for performing the shift control in the direction of arrow at that position have been already registered. By the way, the length of arrow schematically represents the magnitude of correction of the correction value.

At this moment, when M2 and M4 are placed at this position, the photosensitive substrate (the solid line portion) is curvedly deformed in the scanning and non-scanning directions relative to the ideal photosensitive substrate (the broken line portion) which is free from deformation. The correction value for shrinking these M2 and M4 as well as for shifting the regions in the direction of the arrow are registered in the memory device 51. When the shifting mechanism and the magnification correcting mechanism are controlled according to this correction value by the controlling device 50 (in this case, it is controlled such that the magnification is reduced and the regions are shifted toward the center of the photosensitive substrate and in the scanning direction (the direction of X)), these M2 and M4 are corrected in the direction of the arrows shown inside these M2 and M4.

Figure 19C:
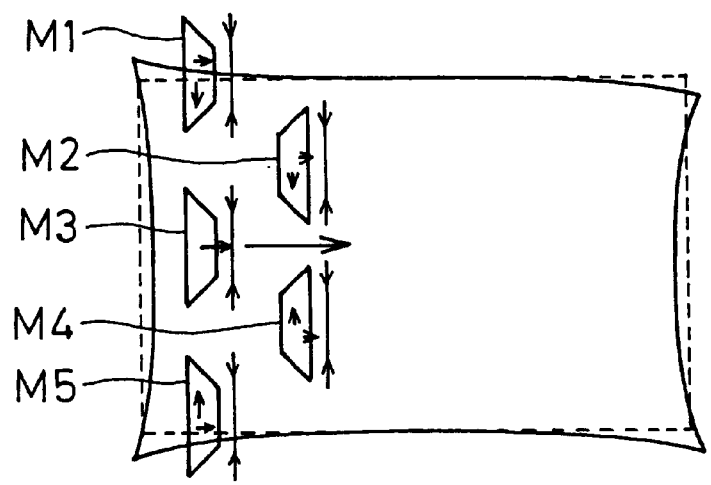

FIG. 19(c) shows a stage wherein M1, M3 and M5 are driven up to the position of M2 and M4 shown in FIG. 19(b). The correction value of M1, M3 and M5 in this case becomes such that corresponds to the correction value employed for correcting M2 and M4 in FIG. 19(b). Therefore, on the basis of the correction value of the projection regions M1, M3 and M5, the shifting mechanism and the magnification correcting mechanism are controlled by the controlling device 50 (in this case, it is controlled such that the magnification is reduced and the regions are shifted toward the center of the photosensitive substrate and in the scanning direction) so as to correct M1 and M5 out of these M1, M3 and M5 in the direction of the arrows shown inside these M1 and M5.

At this moment, the M2 and M4 preceding the M1, M3 and M5 are moved close to the center of the photosensitive substrate, thus reaching a position where the magnitude of deformation is further minimized as compared with the deformation indicated with reference to FIG. 19(b). At this position, the correction value where the magnification and the quantity of shift are reduced as compared with those of the correction value of FIG. 19(b) is registered. Then, the shifting mechanism and the magnification correcting mechanism are controlled according to this correction value by the controlling device 50 (in this case, it is controlled such that the magnification is reduced and the regions are shifted toward the center of the photosensitive substrate and in the scanning direction), thereby correcting these M2 and M4 in the direction of the arrows shown inside these M2 and M4.

Figure 20A:
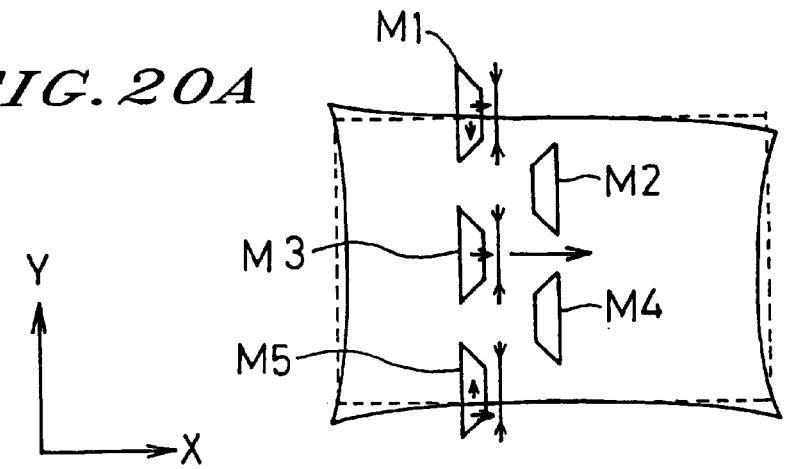
FIG. 20 shows a diagram illustrating the sequence of correction of non-linear components (No. 2)
Figure 20B:
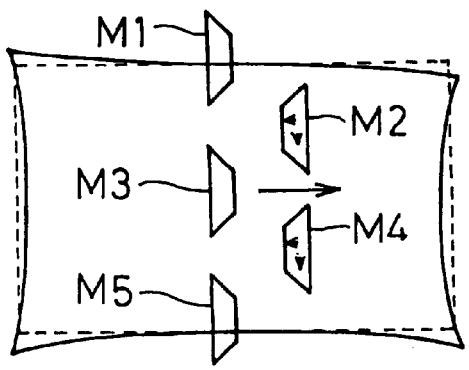
Figure 20C:
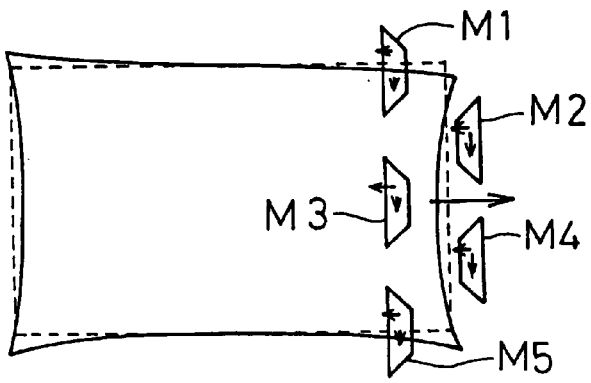
Figure 20D:
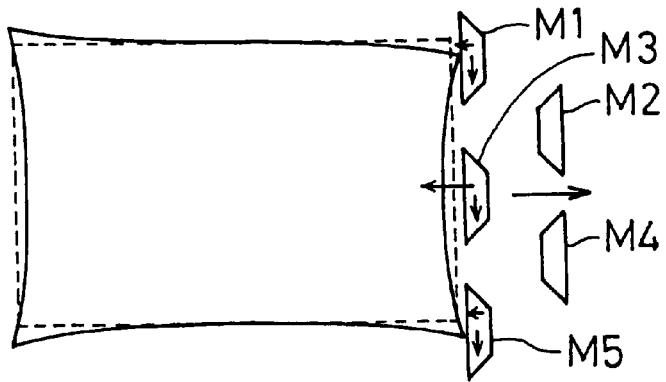

FIG. 20(d) shows a stage wherein M1, M3 and M5 are driven up to the position of M2 and M4 shown in FIG. 19(c). The correction value of M1, M3 and M5 in this case becomes such that corresponds to the correction value employed for correcting M2 and M4 in FIG. 19(c) Therefore, on the basis of the correction value of the projection regions M1, M3 and M5, the shifting mechanism and the magnification correcting mechanism are controlled by the controlling device 50 so as to correct M1 and M5 out of these M1, M3 and M5 in the direction of the arrows shown inside these M1 and M5. At this moment, the M2 and M4 at this location are made free from any deformation of the photosensitive substrate, and hence the correction value thereof is zero. Therefore, the correction of M2 and M4 would not be performed.

FIG. 20(e) shows a stage wherein M1, M3 and M5 are driven up to the position of M2 and M4 shown in FIG. 20(d) or the central portion of the photosensitive substrate. Since there is no deformation of the photosensitive substrate, the correction of M1, M3 and M5 would not be performed. At this moment, M2 and M4 are placed close to the terminal position of the scanning of photosensitive substrate, and when M2 and M4 are placed at this position, the photosensitive substrate (the solid line portion) is slightly deformed in the direction of −Y and in the direction of −X relative to the ideal photosensitive substrate (the broken line portion) which is free from deformation, so that the correction value for shifting these M2 and M4 in the direction of −Y has been already registered in the memory device 51. When the shifting mechanism is controlled in the direction of −Y and in the direction of −X according to this correction value by the controlling device 50, these M2 and M4 are corrected in the direction of the arrows shown inside FIG. 20(e).

FIG. 20(f) shows a stage wherein M1, M3 and M5 are driven up to the position of M2 and M4 shown in FIG. 20(e). The correction value of M1, M3 and M5 in this case becomes such that corresponds to the correction value employed for correcting M2 and M4 in FIG. 20(e). Therefore, on the basis of the correction value of the projection regions M1, M3 and M5, the shifting mechanism is controlled by the controlling device 50 (in this case, the shifting mechanism is controlled in the direction of −Y and in the direction of −X) so as to correct the M1 and M5 among M1, M3 and M5 in the direction of the arrows shown inside the M1 and M5. At this moment, M2 and M4 are placed close to the terminal position of the scanning of photosensitive substrate, and when M2 and M4 are placed at this position, the photosensitive substrate (the solid line portion) is curvedly deformed in the scanning direction as well as in the non-scanning direction relative to the ideal photosensitive substrate (the broken line portion) which is free from deformation. The correction value for shifting these M2 and M4 in the scanning direction as well as in the non-scanning direction are registered in the memory device 51. When the shifting mechanism is controlled in the scanning direction as well as in the non-scanning direction according to this correction value by the controlling device 50, these M2 and M4 are corrected in the direction of the arrows shown inside FIG. 20(f).

Finally, FIG. 20(g) shows a stage wherein M1, M3 and M5 are driven up to the position of M2 and M4 shown in FIG. 20(f). The correction value of M1, M3 and M5 in this case becomes such that corresponds to the correction value employed for correcting M2 and M4 in FIG. 20(e). Therefore, on the basis of the correction value of the projection regions M1, M3 and M5, the shifting mechanism is controlled by the controlling device 50 (in this case, the shifting mechanism is controlled in the direction of −Y and in the direction of −X) so as to correct M1, M3 and M5 in the direction of the arrows shown inside the M1 and M5. At this moment, the exposure of M2 and M4 is finished, so that the controlling of the shifting mechanism and magnification correcting mechanism is no more performed.

As explained above, the non-linear component of exposure error in the scanning direction and in the non-scanning direction is registered in advance as a correction value, and hence, on the basis of this correction value, the image shifting mechanism and the magnification correcting mechanism in the scanning direction of the optical projection systems 12a to 12e can be successively controlled. In FIGS. 19 and 20, the correction of the optical projection system 12a to 12e at a representative position is explained. As a matter of fact however, the number of correction value registered in conformity with the position of exposure is larger than explained above, and at the same time, the magnitude of shift and magnification differ from each other depending on specific position. Further, the optical projection systems 12a to 12e are respectively provided therein with an image-forming characteristic adjusting mechanism 120 which is constituted by a shifter portions (shifting mechanism) 41 and 42, a magnification adjusting portion (magnification adjusting mechanism) 45, and a rotation correcting portion (rotation correcting mechanism) 43, and are individually and successively controlled by means of the controlling device 50.

Next, one example of using the rotation correcting mechanism will be explained.

On the occasion of performing the non-linear correction in the non-scanning direction and in the scanning direction, the controlling device 50 is acted to control the shifting mechanism in the non-scanning direction, shifting mechanism in the scanning direction, magnification correcting mechanism and rotation correcting mechanism of the optical projecting system, thereby making it possible to correct the non-linear shifting component in the non-scanning direction as well as in the scanning direction as well as the magnification component, and at the same time, to smoothly link together the non-linear corrections in the scanning direction.

For example, as shown in FIG. 17, the sequence of correction of the non-linear component as illustrated with reference to FIGS. 19 and 20 will be executed against the photosensitive substrate which is curvedly deformed in both scanning direction and non-scanning direction.

Figure 21:
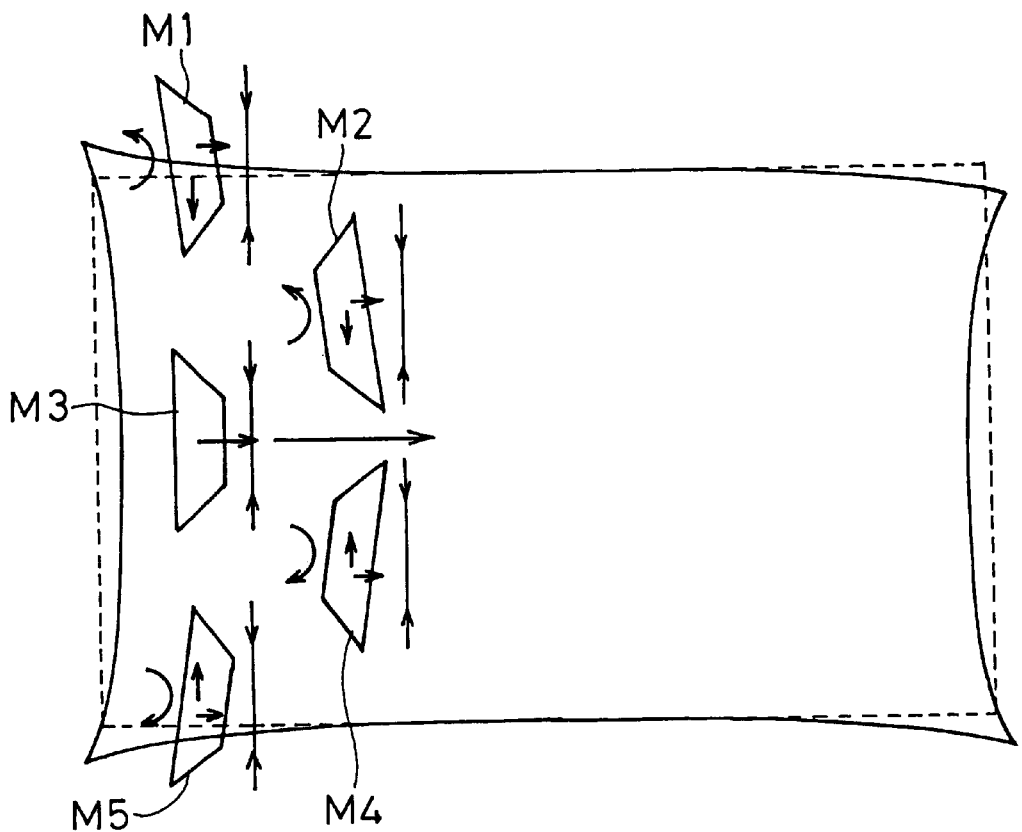
FIG. 21 shows a diagram illustrating the correction of non-linear components.
Figure 22:
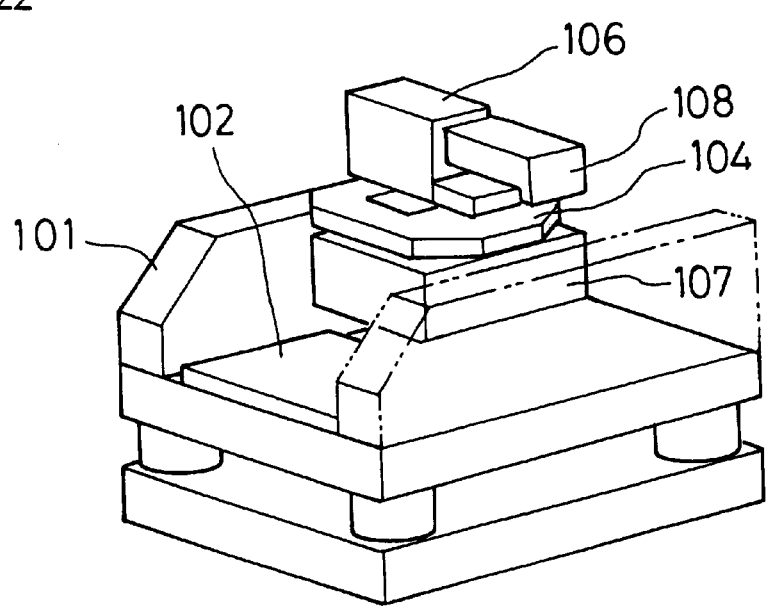
FIG. 22 is a perspective view schematically illustrating the construction of a conventional scanning exposure apparatus.
Figure 23:
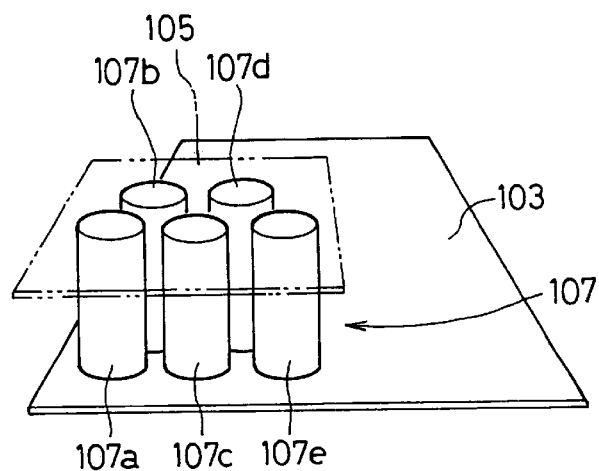
FIG. 23 is a perspective view illustrating a main portion of the exposure apparatus shown in FIG. 22.
Figure 24:
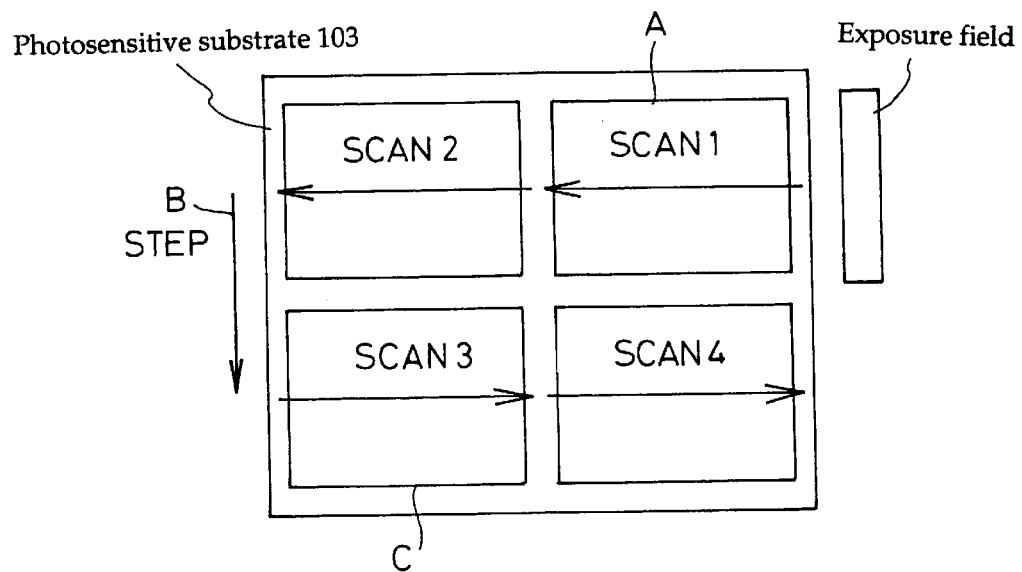
FIG. 24 shows the exposure images of the scan and step according to a conventional scanning exposure apparatus.
Figure 25A:
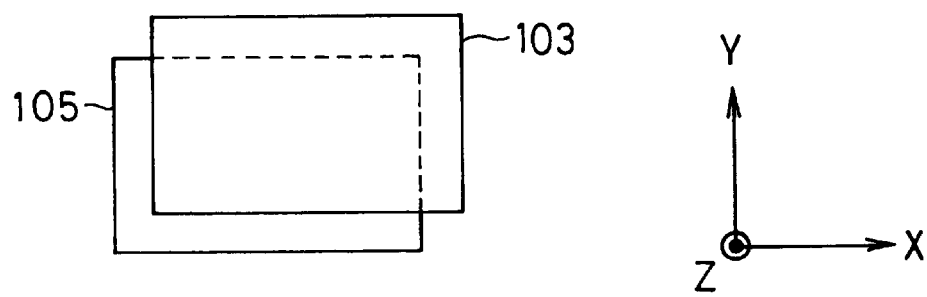
FIG. 25 illustrates the operation of alignment between the mask and the photosensitive substrate, which is performed using a conventional scanning exposure apparatus.
Figure 25B:
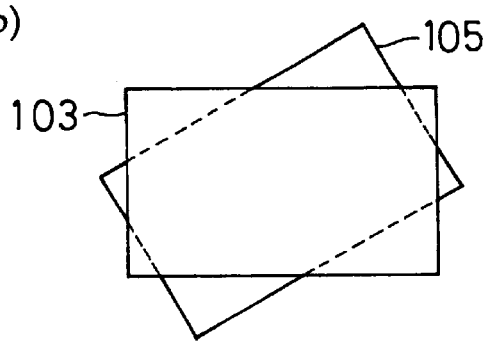
Figure 25C:
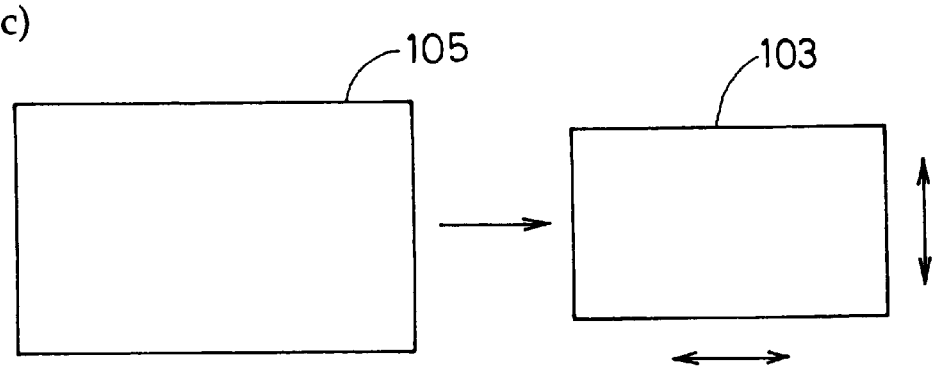
Figure 26A:
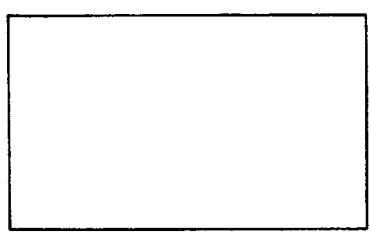
FIG. 26 illustrates how a photosensitive substrate which is originally rectangular in plan view may be deformed.
Figure 26B:
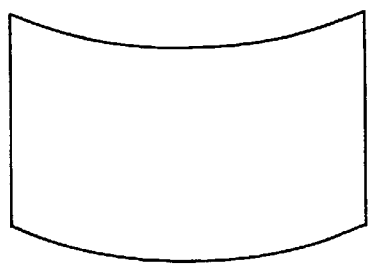
Figure 26B:
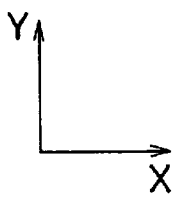
Figure 26C:
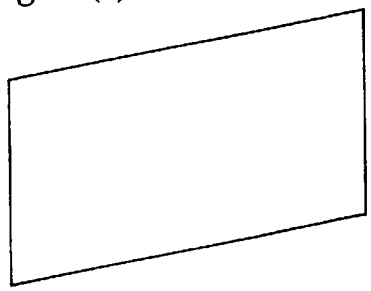

FIG. 21 schematically illustrates one example of correcting the non-linear component by making use of the rotation correcting mechanism. The arrows shown in the vicinity of the projection regions M1 to M5 of the optical projecting system 12a to 12e indicate that the correction for minimizing the magnification at that position will be performed, while the arrows shown inside the projection regions M1 to M5 indicate that the shifting correction will be performed at that position and in the direction of these arrows. Additionally, the curved arrows indicate that the rotationaly correction will be performed in the direction indicated by these arrows.

The correction value for the corresponding photosensitive substrate is stored in advance in the memory device 51 through the exposure treatment and the correction value registration of the flow shown in FIG. 12. On the other hand, the controlling device 50 acts, on the basis of the correction value thus read out, to calculate the target positions of the shifting mechanism in the non-scanning direction and in the scanning direction, of the magnification correcting mechanism, and of the rotation correcting mechanism, and then, to drive these adjusting mechanisms during the scanning exposure. According to this embodiment especially, by making use of the rotation correcting portion 43 (rotation correcting mechanism) of the image-forming characteristic adjusting mechanism 120, the projection regions M1, M2, M4 and M5 are subjected to the rotation correction in conformity with the deformation of the photosensitive substrate which is curvedly deformed in both scanning direction and non-scanning direction. As a result, it becomes possible to smoothly link the projection regions M2 and M4 with the projection regions M1, M3 and M5, and to perform the exposure of one continuous large pattern which is free from non-uniformity of exposure.

By the way, when it is designed such that an optical beam is allowed to pass through the field diaphragm 34 after the rotation correcting portion as shown in FIGS. 2 and 3, the position of the projection region would not be changed but only the pattern to be projected to the region would be caused to turn. Therefore, if it is desired to perform the correction in the same manner as in FIG. 21, the rotation correcting portion should be attached to the rectangular prism 35.

According to the scanning exposure apparatus explained above, the non-linear component of error is determined in advance on the basis of the result of exposure and the result thus determined is stored in the memory device 51 as a correction value for the apparatus, thereby enabling the pattern exposure to be performed while continuously controlling the image-adjusting mechanism in the scanning direction and in the non-scanning direction of the optical projecting system on the basis of the correction value. Therefore, in order to store the correction value in the memory device 51, it is required to measure the correction by making use of the mask 10 and the photosensitive substrate 14 (however, the measurement of the error is required to be performed in advance only when the registration of data is required, and the data thus obtained can be stored for use. Therefore, if data required is already registered, the measurement of the error is not required to be performed).

In this case, if the measurement point for correcting the non-linear component is arranged at a large number of portions of the photosensitive substrate, thus enabling these measurement points to be detected on the occasion of alignment so as to determine the correction value, it would be possible to provide a scanning exposure apparatus wherein no trial exposure would be required to be performed. For example, instead of using the measurement points shown in FIGS. 6 and 18, a large number of alignment marks may be formed, thereby enabling both of the linear component and the non-linear component to be calculated through the detection of the position of these alignments. It is also possible to employ an alignment mark for the non-linear correction in the non-scanning direction, and to employ a vernier or a lap measuring mark for the non-linear correction in the scanning direction. By the way, if a large number of alignment marks are disposed, it is possible to suitably perform the correction even if the photosensitive substrate is accompanied with a random non-linear component. Further, it is also possible to adopt a method wherein the exposure pattern (actual pattern) that has been produced on the surface of the photosensitive substrate 14 may be directly read out instead of the aforementioned marks, and the result thus read out is then subjected to an image processing so as to determine the magnitude of deformation of the photosensitive substrate 14.

According to the aforementioned embodiment, since the number of alignment mark is increased during the exposure, the treatment capacity may be deteriorated, thus raising a problem. Therefore, the aforementioned embodiment may not be executed against all of the photosensitive substrate but may be applied to only the initial lot or initial several number of photosensitive substrates, the remaining photosensitive substrates being corrected on the basis of the results obtained from the initial execution. If the correction is performed in this manner, the error can be minimized without deteriorating the treatment capacity.

By the way, the aforementioned embodiments illustrate example where the present invention is applied to an exposure apparatus provided with a plurality of image-forming optical system. However, the method of not employing a trial exposure, or the method of executing the exposure against only the initial lot or initial several number of photosensitive substrates would be applicable even to an exposure apparatus other than the exposure apparatus provided with a plurality of image-forming optical system.

Further, depending on the kind of pattern of mask, i.e. a pattern where not so high precision is required, or a pattern where a high precision is required, the method of the present invention may be selectively executed.

In the aforementioned embodiment, the rotation correcting portion and the magnitude adjusting portion are both attached to the upper Dyson type optical system. However, they may be attached to the lower Dyson type optical system, or may be separately attached to the upper and lower Dyson type optical systems. Further, although the shifters 41 and 42 are interposed between the mask 10 and the lens 32, they may be interposed between the substrate 14 and the projector lens 36.

Even in a situation where there is an error in traveling accuracy of stage, so that a rect-linear scanning can be performed in an exposure apparatus wherein the stage mounting a substrate thereon is designed to be scanned relative to the optical projecting system, it is possible to perform the exposure of pattern with high precision against a substrate by optically correcting the position of projected image by making use of the image-forming characteristic adjusting mechanism of the present invention that can be mounted on an optical projecting system.

In the foregoing explanation, the monitoring of the magnitude of rotation of rectangular prism 31 is performed by detecting the image projected onto a stage by making use of an image-pickup element, and then, the mask pattern is matched with the image. However, the magnitude of actual inclination of the regular prism 31 may be measured by irradiating an optical beam against the surface of the rectangular prism 31 and then, measuring the position of the reflected beam.

As for the picturing error of the mask pattern, it is possible to correct it on the occasion of projecting the pattern onto a substrate by making use of the image-forming characteristic adjusting mechanism of the present invention which is mounted on an optical projecting system.

According to the present invention, since the optical projecting system is provided with an image-forming characteristic adjusting mechanism which is capable of adjusting the position of a projected image on a substrate so as to make it possible to control the shifting, rotation, position of focus and magnification of the projected image, the adjustment of the optical system on the occasion of assembling it can be easily performed, and even if re-adjustment is necessitated during the operation of the apparatus, the re-adjustment can be finished within a short period of time, thereby shortening the apparatus-stopping time. Further, it is also possible to minimize the residual component of error of linear correction in the scanning exposure, thereby making it possible to enhance the fineness of pattern in spite of the recent trend to enlarge the size of the photosensitive substrate and device.

What is claimed is:

1. An exposure apparatus for projecting a pattern of mask onto a substrate through an optical projecting system while synchronously scanning a mask having the pattern and the substrate in a predetermined scanning direction;
   wherein the optical projecting system includes a scanning direction adjusting configured to adjust a position of scanning direction of a projected image to be projected onto the substrate;
   wherein one of the Dyson type optical systems includes an optical magnification adjustment system disposed at a midway of optical path formed between the reflecting prism and the lens.

2. An exposure apparatus for projecting a pattern of mask onto a substrate through an optical projecting system while synchronously scanning a mask having the pattern and the substrate in a predetermined scanning direction;
   wherein the optical projecting system includes a scanning direction adjuster configured to adjust a position of scanning direction of a projected image to be projected onto the substrate;
   wherein the optical projecting system includes a plurality of optical projecting system modules disposed along a direction intersecting the scanning direction; and
   wherein the scanning direction adjuster adjusts the position of a projected image in the scanning direction of each of the plurality of optical projecting system modules.

3. The exposure apparatus according to claim 2, wherein patterning exposure against the substrate is performed by allowing a portion of images projected by the plurality of optical projecting system modules to be overlapped with each other.

4. The exposure apparatus according to claim 3, wherein the scanning direction adjuster adjusts the position of the projected image in accordance with changes in configuration of the substrate.

5. An exposure apparatus for projecting a pattern of mask onto a substrate through an optical projecting system while synchronously scanning a mask having the pattern and the substrate in a predetermined scanning direction;
   wherein the optical projecting system includes a scanning direction adjuster configured to adjust the position of scanning direction of a projected image to be projected onto the substrate;
   wherein the scanning direction adjuster includes at least one of a magnification adjustment mechanism configured to adjust a magnification of the optical projecting system and an image rotation mechanism configured to rotate a projected image produced through the optical projecting system; and
   wherein the optical projecting system includes a combination of a pair of a Dyson type optical systems each system including a reflecting prism, a driving member for driving the reflecting prism, lens and a concave mirror.

6. An exposure method for projecting a pattern of mask onto a substrate through an optical projecting system while synchronously scanning a mask having the pattern and the substrate in a predetermined scanning direction, the method comprising:
   adjusting a position of scanning direction of a projected image to be projected onto the substrate by the optical projecting system;
   wherein the optical projecting system includes a plurality of optical projecting system modules disposed along a direction intersecting the scanning direction; and
   wherein the adjustment of position of scanning direction is performed by adjusting the position of a projected image in the scanning direction of each of the plurality of optical projecting system modules.

7. The exposure method according to claim 6, wherein patterning exposure against the substrate is performed by allowing a portion of images projected by the plurality of optical projecting system modules to be overlapped with each other.

8. The exposure method according to claim 7, wherein the adjustment in position of scanning direction is performed in accordance with changes in configuration of the substrate.

9. An exposure method for projecting a pattern of mask onto a substrate through an optical projecting system while synchronously scanning a mask having the pattern and the substrate in a predetermined scanning direction, the method comprising:
   adjusting a position of scanning direciton of a projected image to be projected onto the substrate; and
   performing at least one of adjusting a magnification of the optical projecting system and rotating an image projected through the optical projecting system,
   wherein the optical projecting system includes a scanning direction adjuster configured to adjust a position of scanning direction of a projected image to be projected onto the substrate; and
   wherein the optical projecting system includes a combination of a pair of Dyson type optical system each system including a reflecting prism, a driving member for driving the reflecting prism, lens and a concave mirror.

10. The exposure method according to claim 6, wherein the adjustment in position of scanning direction is performed in accordance with changes in configuration of the substrate.

11. The exposure method according to claim 6, further comprising:
    performing at least one of adjusting a magnification of the optical projecting system and rotating an image projected through the optical projecting system.

12. The exposure method according to claim 7, further comprising:
    performing at least one of adjusting a magnification of the optical projecting system and rotating an image projected through the optical projecting system.

13. The exposure method according to claim 8, further comprising:
    performing at least one of adjusting a magnification of the optical projecting system and rotating an image projected through the optical projecting system.

14. The exposure method according to claim 10, further comprising:

performing at least one of adjusting a magnification of the optical projecting system and rotating an image projected through the optical projecting system.

15. The exposure apparatus according to claim 1, wherein the scanning direction adjuster adjusts the position of the projected image in accordance with changes in configuration of the substrate.

16. The exposure apparatus according to claim 2, wherein the scanning direction adjuster adjusts the position of the projected image in accordance with changes in configuration of the substrate.

17. The exposure apparatus according to claim 2, wherein the scanning direction adjuster includes at least one of a magnification adjustment mechanism configured to adjust a magnification of the optical projecting system and an image rotation mechanism configured to rotate a projected image produced through the optical projecting system.

18. The exposure apparatus according to claim 4, wherein the scanning direction adjuster is provided with a magnification adjustment mechanism for performing the adjustment of magnification of the optical projecting system and/or an image rotation mechanism for rotating a projected image produced through the optical projecting system.

19. The exposure apparatus according to claim 16, wherein the scanning direction adjuster includes at least one of a magnification adjustment mechanism configured to adjust a magnification of the optical projecting system and an image rotation mechanism configured to rotate a projected image produced through the optical projecting system.

20. The exposure apparatus according to claim 5, wherein the scanning direction adjuster adjusts the position of the projected image in accordance with changes in configuration of the substrate.

21. The exposure apparatus according to claim 6, wherein the scanning direction adjuster includes a storage unit configured to store a correction amount for the amount of deformation of the configuration of a photosensitive substrate which is measured in advance, and wherein the scanning direction adjuster continuously adjusts the position of the projected image during the scanning on the basis of the correction amount.

22. The exposure method according to claim 9, wherein the adjustment in position of scanning direciton is performed in accordance with changes in configuration of the substrate.

23. The exposure method according to claim 9, wherein the adjustment in position of scanning direction is carried out by measuring the configuration of the substrate, storing a correction amount for the amount of deformation of the measured configuration of the substrate, and continuously adjusting the position during the scanning on the basis of the correction amount.

* * * * *